US007016235B2

(12) United States Patent
Faue et al.

(10) Patent No.: US 7,016,235 B2
(45) Date of Patent: Mar. 21, 2006

(54) DATA SORTING IN MEMORIES

(75) Inventors: Jon Allan Faue, Colorado Springs, CO (US); Steve S. Eaton, San Jose, CA (US)

(73) Assignee: ProMOS Technologies Pte. Ltd., (SG)

( * ) Notice: Subject to any disclaimer, the term of this patent is extended or adjusted under 35 U.S.C. 154(b) by 37 days.

(21) Appl. No.: 10/794,782

(22) Filed: Mar. 3, 2004

(65) Prior Publication Data

US 2005/0195679 A1   Sep. 8, 2005

(51) Int. Cl.
*G11C 7/00* (2006.01)
(52) U.S. Cl. .......................... 365/189.02; 365/230.03; 365/233; 365/238.5
(58) Field of Classification Search ............ 365/238.5, 365/189.02, 230.02, 230.03, 233
See application file for complete search history.

(56) References Cited

U.S. PATENT DOCUMENTS

| | | | |
|---|---|---|---|
| 6,011,737 A | 1/2000 | Li et al. ...................... 365/207 |
| 6,115,321 A | 9/2000 | Koelling et al. ............. 365/233 |
| 6,285,578 B1 | 9/2001 | Huang ......................... 365/154 |
| 6,522,599 B1 * | 2/2003 | Ooishi et al. ................ 365/233 |
| 6,563,747 B1 | 5/2003 | Faue ........................... 365/193 |
| 6,597,630 B1 | 7/2003 | Konishi et al. .............. 365/233 |
| 6,600,691 B1 | 7/2003 | Morzano et al. ............ 365/219 |
| 6,621,747 B1 | 9/2003 | Faue ............................ 365/194 |
| 6,687,181 B1 * | 2/2004 | Usuki et al. ............ 365/230.03 |
| 6,775,201 B1 * | 8/2004 | Lee et al. ............... 365/230.04 |
| 2002/0149960 A1 | 10/2002 | Yoo et al. ...................... 365/63 |
| 2003/0026161 A1 | 2/2003 | Yamaguchi et al. ... 365/230.03 |
| 2004/0098551 A1 * | 5/2004 | Heo et al. .................... 711/167 |

OTHER PUBLICATIONS

JEDEC Standard: DDR2 SDRAM Specification: JESD79-2A, Jan. 2004, JEDEC Solid State Technology Association.
Preliminary Data Sheet: 1G bits DDR2 SDRAM: EDE1104AASE (256M words×4 bits): EDE1108AASE (128M words×8bits); Elpida Memory, Inc. 2003.
Davis, Brian; Mudge, Trevor; Jacob, Bruce; Cuppu, Vinodh "DDR2 and Low Latency Variants" Electrical Engineering and Computer Science, University of Michigan, Ann Arbor; Electrical & Computer Engineering, University of Maryland, College Park, pp. 1-15.
HYS64T32000GDL (256 Mbyte): HYS64R64020GDL (512 Mbyte) DDR2 Small Outline DIMM Modules; Data Sheet, vol. 82, Oct. 2003, Infineon Technologies.
Preliminary Data Sheet: 512 M bits DDR SDRAM: EDD5104ABTA (128M words×4 bits): EDD5108ABTA (64M words×8 bits); Elpida Memory, Inc. 2002-2003.
JEDEC Standard: Double Data Rate (DDR) SDRAM Specification: JESD79D, Jan. 2004, JEDEC Solid State Technology Association.

* cited by examiner

*Primary Examiner*—Son Mai
(74) *Attorney, Agent, or Firm*—Michael Shenker; MacPherson Kwok Chen & Heid LLP

(57) ABSTRACT

A sorting circuit (140) transfers data between a first group of at least four lines (134) on which the data items are arranged based on their addresses, and a second group of lines (138, WD0R, WD0F, WD1R, WD1F) on which the data items are arranged based on the order in which they are read or written in a burst operation. Six signals (SORT) and their complements are sufficient to control the sorting circuit for both the read and the write operations, and provide both the DDR and the DDR2 functionality.

30 Claims, 17 Drawing Sheets

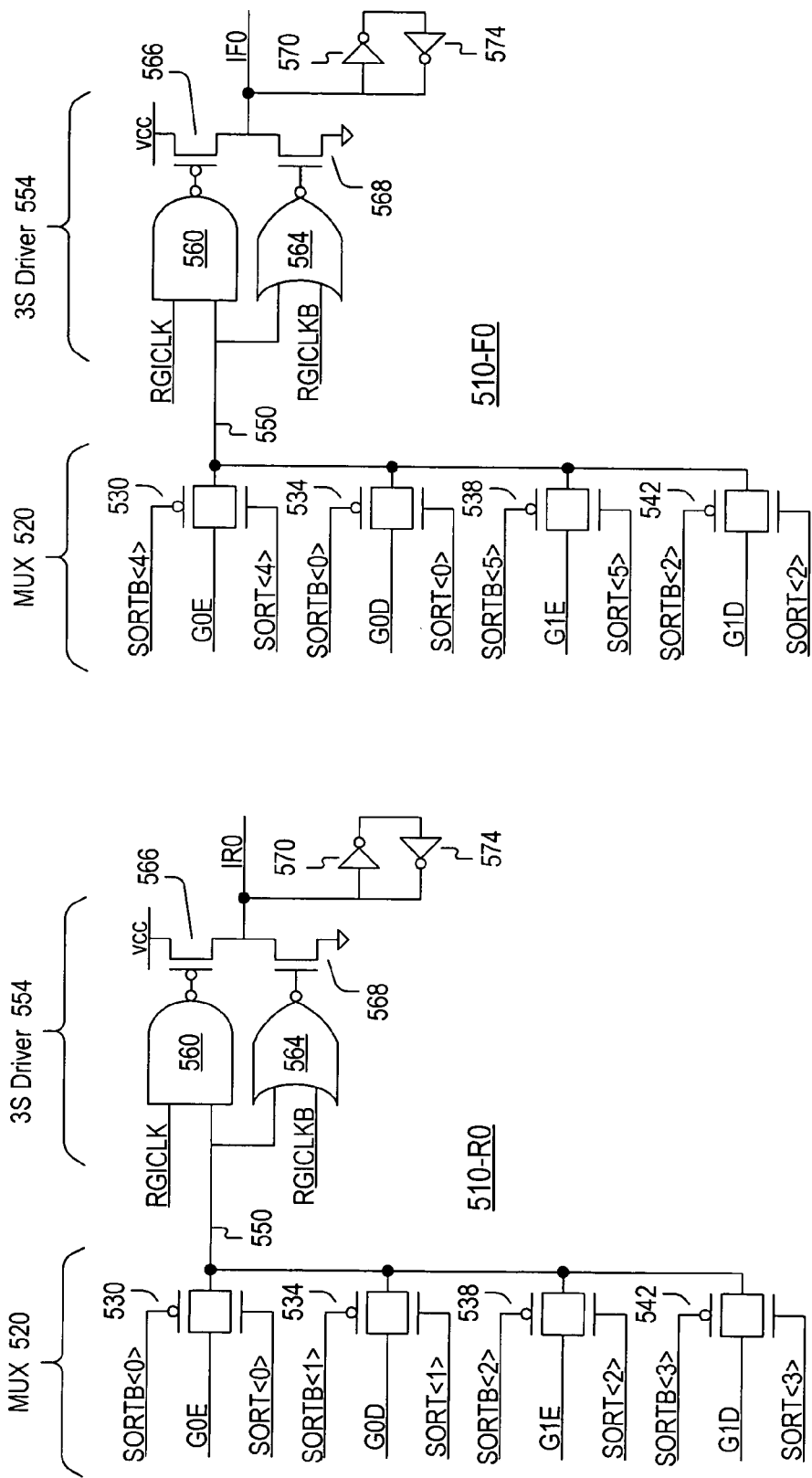

DATA SORTING IN MEMORIES

BACKGROUND OF THE INVENTION

The present invention relates to integrated circuits, and more particularly to memories.

FIG. 1 illustrates a prior art DRAM (dynamic random access memory). Memory array 110 has DRAM memory cells arranged in rows and columns. Each cell has a capacitor and an access transistor connected in series. Each memory row corresponds to a wordline WL. To read the memory, the corresponding wordline WL is activated, and the data signals for the corresponding row appear on bitlines BL. The bitline signals are amplified by sense amplifiers (not shown). Y select circuit 130 selects one or more memory columns and couples the corresponding bitlines to a data path leading to a memory output terminal DQ. In a write operation, a reverse data path is provided from terminal DQ to the memory array.

To increase memory bandwidth, multiple data items can be prefetched in parallel from memory array 110 for a serial output on the DQ terminal. For example, in DDR (double date rate) synchronous DRAMs, two data bits are prefetched in parallel for sequential output on the rising and falling edges of a clock signal in a burst read operation (one bit is provided on terminal DQ on the rising edge, the other bit on the falling edge). Likewise, in a burst write operation, two data bits are received serially at the terminal DQ on the rising and falling edges of a clock cycle, and written to array 110 in parallel.

The parallel-to-serial and serial-to-parallel conversion of data within the memory is complicated by the requirement to provide different data ordering schemes in the DDR and some other kinds of memories. The DDR standard defines the following data sequences for the burst read and write operations (see JEDEC Standard JESD79D, JEDEC Solid State Technology Association, January 2004, incorporated herein by reference):

TABLE 1

DDR BURST OPERATIONS

| Burst Length | Starting CL Address | Data Sequence (i.e. Address Sequence) within the Burst | |
|---|---|---|---|
| | | Interleaved | Sequential |
| | A0 | | |
| 2 | 0 | 0-1 | 0-1 |
| | 1 | 1-0 | 1-0 |
| | A1 A0 | | |
| 4 | 00 | 0-1-2-3 | 0-1-2-3 |
| | 01 | 1-0-3-2 | 1-2-3-0 |
| | 10 | 2-3-0-1 | 2-3-0-1 |
| | 11 | 3-2-1-0 | 3-0-1-2 |
| | A2 A1 A0 | | |
| 8 | 000 | 0-1-2-3-4-5-6-7 | 0-1-2-3-4-5-6-7 |
| | 001 | 1-0-3-2-5-4-7-6 | 1-2-3-4-5-6-7-0 |
| | 010 | 2-3-0-1-6-7-4-5 | 2-3-4-5-6-7-0-1 |
| | 011 | 3-2-1-0-7-6-5-4 | 3-4-5-6-7-0-1-2 |
| | 100 | 4-5-6-7-0-1-2-3 | 4-5-6-7-0-1-2-3 |
| | 101 | 5-4-7-6-1-0-3-2 | 5-6-7-0-1-2-3-4 |
| | 110 | 6-7-4-5-2-3-0-1 | 6-7-0-1-2-3-4-5 |
| | 111 | 7-6-5-4-3-2-1-0 | 7-0-1-2-3-4-5-6 |

Here A2, A1, A0 are the three least significant bits (LSB) of a burst operation's "starting address" An . . . A2A1A0 (or A<n:0>). For each burst length (2, 4, or 8), and each starting address, the DDR standard defines a sequential type ordering and an interleaved type ordering. The burst length and type are written to the memory mode register (not shown) before the burst begins. The data are read from, or written to, a block of 2, 4, or 8 memory locations. The block address is defined by the most significant address bits (bits A<n:3> for burst length of 8, bits A<n:2> for burst length of 4, bits A<n:1> for burst length of 2). The least significant address bits and the burst type define the data ordering within the block. For example, for the burst length of 4, the starting address A<n:0>=x . . . x01, and the interleaved type, the data are read or written at a block of four memory locations at addresses x . . . x00 through x . . . x11 in the order 1-0-3-2 (Table 1), i.e. the first data item is written to address x . . . x01, the second data item to address x . . . x00, the third data item to address x . . . x11, and the fourth data item to address x . . . x10 (the data ordering is the order of the address LSB's).

FIG. 1 illustrates a write data path for a DDR memory with a two bit prefetch as described in U.S. Pat. No. 6,621,747 issued Sep. 16, 2003 to Faue. Serial to parallel converter 132 performs a serial to parallel conversion on each pair of serial data bits received in a clock cycle on terminal DQ. Converter 132 drives a line IR with the first of the two bits (the bit received on the rising edge of the clock cycle), and drives another line IF with the second bit, received on the falling edge of the clock cycle. Lines IR, IF are shown at 138. Write data sort circuit 140 (WDSORT) re-orders the bits and drives a line G0 with the bit to be written to a memory location with A0=0, and the line G1 with the bit to be written to a location with A0=1. Lines G0, G1 are shown at 134. Y select circuit 130 selects the appropriate memory columns to write the two bits in parallel from lines 134 to their respective memory locations.

U.S. Pat. No. 6,115,321 (issued Sep. 5, 2000 to Koelling et al.) describes a memory with a four bit prefetch. There are four lines 134 and four lines 138. Sorting circuit 140 is used for both the read and the write accesses. The proper data ordering for Table 1 is achieved via a cooperative operation of circuit 140 and Y select circuit 130.

U.S. Pat. No. 6,600,691 (issued Jul. 29, 2003 to Morzano et al.) describes a read data path that can be used for a DDR2 memory. DDR2 is defined in JDEC standard JESD79-2A (JEDEC Solid State Technology Association, January 2004) incorporated herein by reference. The DDR2 standard specifies a double data rate memory (one data item on each clock cycle edge) with a four bit prefetch with the following burst data sequences:

TABLE 2

DDR2 BURST OPERATIONS

| Burst Length | Starting CL Address | Data Sequence within the Burst | |
|---|---|---|---|
| | | Interleaved | Sequential |
| | A1 A0 | | |
| 4 | 00 | 0-1-2-3 | 0-1-2-3 |
| | 01 | 1-0-3-2 | 1-2-3-0 |
| | 10 | 2-3-0-1 | 2-3-0-1 |
| | 11 | 3-2-1-0 | 3-0-1-2 |
| | A2 A1 A0 | | |
| 8 | 000 | 0-1-2-3-4-5-6-7 | 0-1-2-3-4-5-6-7 |
| | 001 | 1-0-3-2-5-4-7-6 | 1-2-3-0-5-6-7-4 |
| | 010 | 2-3-0-1-6-7-4-5 | 2-3-0-1-6-7-4-5 |

TABLE 2-continued

DDR2 BURST OPERATIONS

| Burst Length | Starting CL Address | Data Sequence within the Burst | |
|---|---|---|---|
| | | Interleaved | Sequential |
| | 011 | 3-2-1-0-7-6-5-4 | 3-0-1-2-7-4-5-6 |
| | 100 | 4-5-6-7-0-1-2-3 | 4-5-6-7-0-1-2-3 |
| | 101 | 5-4-7-6-1-0-3-2 | 5-6-7-4-1-2-3-0 |
| | 110 | 6-7-4-5-2-3-0-1 | 6-7-4-5-2-3-0-1 |
| | 111 | 7-6-5-4-3-2-1-0 | 7-4-5-6-3-0-1-2 |

Improved burst operation circuitry for DDR, DDR2, and other memories is desirable.

SUMMARY

This section summarizes some features of the invention. Other features are described in the subsequent sections. The invention is defined by the appended claims which are incorporated into this section by reference.

In some aspects of the invention, read and write sorting circuits are provided for a memory with a prefetch of four or more data items, each data item having one or more data bits (for a memory with multiple data terminals, four or more bits are prefetched for each data terminal). In the read sorting circuit, for each output data terminal, four or more transistors are provided to select from the four or more prefetched data bits and provide the selected bit for output in a burst operation. The transistors are connected in parallel between the nodes receiving the prefetched bits and a node providing the selected bit. A similar group of transistors is provided in the write sorting circuit. All of the read and write sorting transistors are controlled by signals that are functions of the starting burst address, the burst type (interleaved or sequential), and the burst length. These functions belong to a group of six functions and their inverses. In some DDR2 embodiments, the Y select signals do not relate to the data sorting, i.e. the Y select signals are only functions of the most significant address bits, not of the burst length, the burst type, or the least significant address bits. In some embodiments, the same data sorting circuitry is suitable for both the DDR and DDR2 operation. A metal mask option, a fuse, or other methods can be used to configure the memory for DDR or DDR2 as desired.

Another aspect of the invention relates to placement of data sorting circuits, including the prior art sorting circuits. A memory may have a number of memory banks. Each bank has one or more memory arrays and the corresponding sense amplifiers and write buffers (the buffers adjacent to the array that write the data into the arrays). The memory banks are spread over a large area. This may result in a long data path between at least some of the arrays and the DQ terminal, specifically between the sense amplifier and write buffer circuitry and the DQ terminal. To speed up memory operation, buffers (amplifiers) can be placed some place in the middle of the data path. The inventors have observed that it is efficient to place the data buffers near the sorting circuitry because the sorting circuitry can weaken the data signals. Therefore, the sorting circuitry is placed in the middle portion of the data path defined by the G-lines (such as the lines G0, G1 in FIG. 1) and the I-lines (IR, IF). In some embodiments, at least some of the G-lines and/or at least some of the I-lines are used both for reading and writing. Each of the G-lines and I-lines runs uninterrupted from a driver's output to another driver's input, and each line is connected to the driver's output without a switch adjacent to the driver's output. If a switch is present in series with the line, the switch is placed adjacent to an input device (e.g. amplifier) that receives signals from the line, not adjacent to the output of the driver that drives the line.

Other features and advantages of the invention are described below. The invention is defined by the appended claims.

BRIEF DESCRIPTION OF THE DRAWINGS

FIGS. 5A, 5B, 5C, 5D, 6A, 6B, 7A, 7B, 7C, 7D, 8A, 8B, 8C, 8D, 9A, 9B are circuit diagrams of memory circuits according to embodiments of the present invention.

DESCRIPTION OF SOME EMBODIMENTS

The embodiments described in this section illustrate but do not limit the invention. The invention is not limited to particular circuitry, memory size or number of I/O terminals, and other details. The invention is defined by the appended claims.

Figure 1:
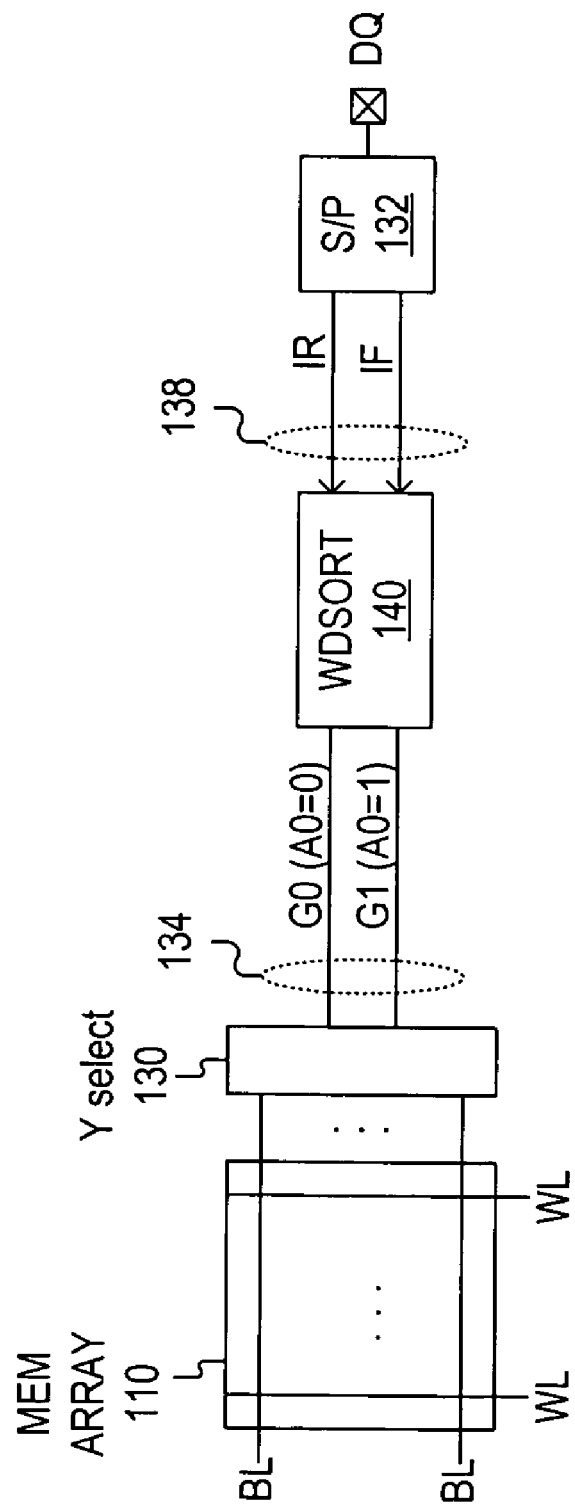
FIG. 1 is a block diagram of a prior art memory circuit.
Figure 2:
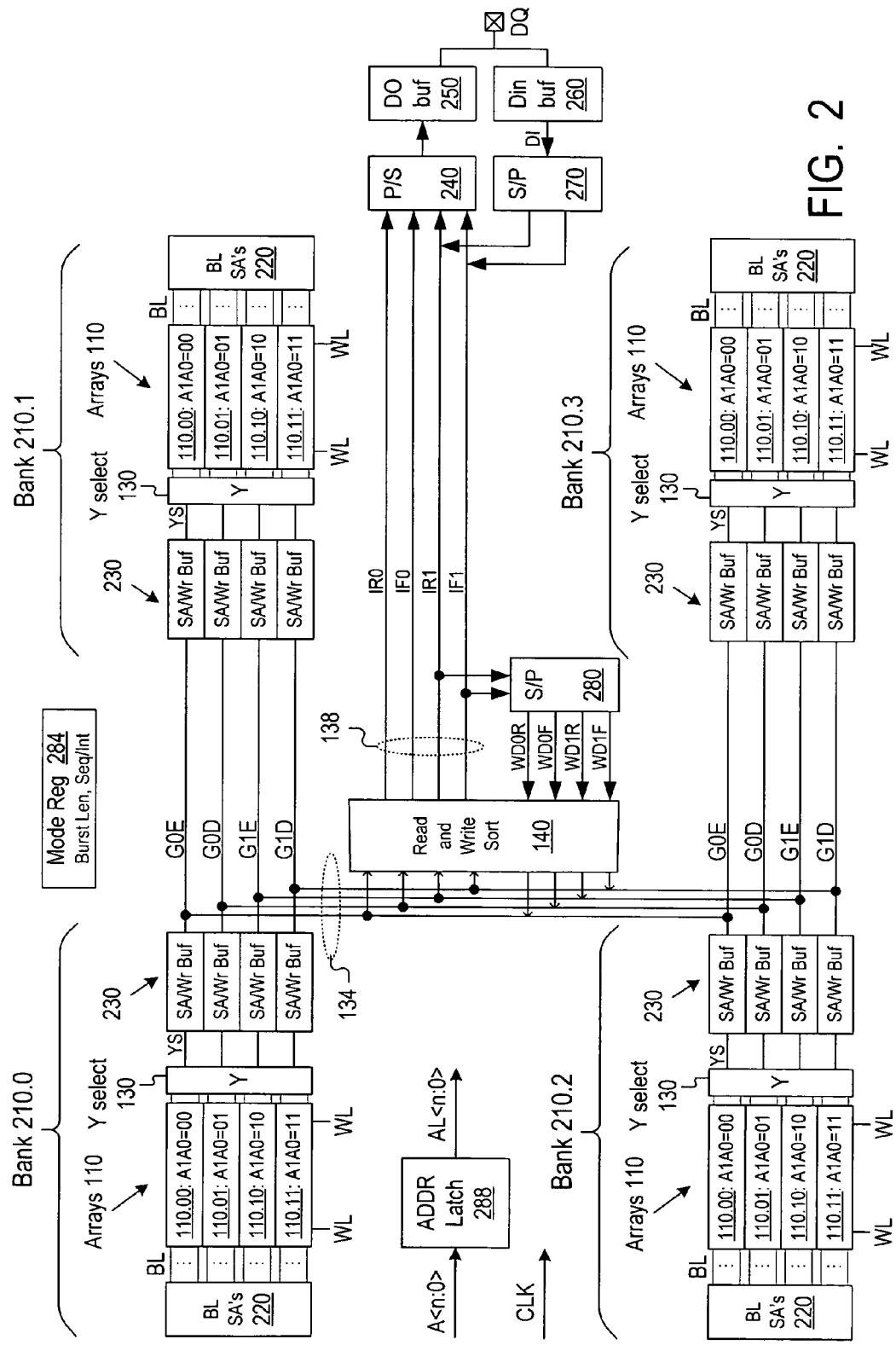
FIGS. 2–4 are block diagrams of memory circuits according to embodiments of the present invention.

FIG. 2 is a block diagram of a memory with a prefetch of four data items that provides the DDR2 (Table 2) burst operations. The memory has four data banks 210.0–210.3. Each bank has four memory arrays 110.00, 110.01, 110.10. 110.11 corresponding to the address bit A1A0 values 00, 01, 10, 11. Array 110.00 has memory locations with A1A0=00, array 110.01 has memory locations with A1A0=01, array 110.10 has memory locations with A1A0=10, array 110.11 has memory locations with A1A0=11. A number of bitlines BL run horizontally through each array, and a number of wordlines WL run vertically. Each wordline runs through all the arrays of a memory bank. The wordlines are driven by row address decoders (not shown) as known in the art. Bitline sense amplifiers 220 amplify the signals on the bitlines. See e.g. U.S. Pat. No. 6,011,737 issued Jan. 4, 2000 to Li et al. and incorporated herein by reference. Y select circuit 130 selects a number of bitlines from each array corresponding to column address signals (not shown in FIG. 2). The Y select circuit consists of a number of pass transistors (not shown in FIG. 2) each of which couples a bitline BL to a line YS when the transistor is on. Address bits A1A0 are "don't care" for the Y select circuit. FIG. 2 shows only one external data terminal DQ, and each Y select circuit selects a single bit of data (e.g. a single bitline or a pair of bitlines depending on the memory architecture) from each array 110.ij (i.e. each array 110.00, 110.01, 110.10, 110.11). If the memory has a number of DQ terminals (e.g. 4, 8, or 16 terminals as in the DDR2 standard), then each Y select circuit will select a data item of 4, 8, 16, or some other number of bits from each array 110.ij, one bit being selected for each DQ terminal.

The YS lines can be connected to the respective G-lines 134 directly or through secondary sense amplifiers in blocks 230. Each block 230 includes sense amplifier and write buffer circuitry for one of the arrays 110.00–110.11. The memory includes four G lines G0E, G0D, G1E, G1D for each data terminal DQ. Line G1E carries data to and from the arrays 110.00 of all the memory banks. Line G0D carries data to and from the arrays 110.01. Line G1E carries data to and from the arrays 110.10. Line G1D carries data to and from the arrays 110.11. If the memory has some number N of data terminals, then the same number N of G-lines can be provided for the arrays 110.00, N G-lines for the arrays 110.01, N G-lines for the arrays 110.10, and N G-lines for the arrays 110.11. For example, if N=16, there can be sixteen lines G1E<0:15> for arrays 110.00, sixteen lines G0D<0:15> for arrays 110.01, and so on.

In burst read operations, sorting circuit 140 couples the G lines 134 to I-lines 138 in accordance with Table 2. Four I-lines IR0 (clock cycle 0, rising edge), IF0 (clock cycle 0, falling edge), IR1 (clock cycle 1, rising edge), IF1 (clock cycle 1, falling edge) are provided for each terminal DQ. Parallel to serial converter 240 (e.g. a shift register) converts the parallel data on the I-lines to a serial format in the order IR0, IF0, IR1, IF1. Data output buffer 250 converts the data signals to suitable voltage and current levels and provides the data on terminal (or terminals) DQ in two consecutive clock cycles. These clock cycles are marked as "CLOCK 0" and "CLOCK 1" in each read operation in the timing diagram in FIG. 10. These clock cycles are numbered as T+3, T+4 for a read command issued in cycle T, and as T+6, T+7 for a read command issued in cycle T+3. The CAS latency (defined in the DDR2 and DDR standards) is 3 clock cycles.

For the burst length of 8, the steps described above are repeated, and four more data items are transferred to terminal DQ from lines IR0, IF0, IR1, IF1, in that order, so that 8 data items are output in 4 consecutive clock cycles.

Figure 11:
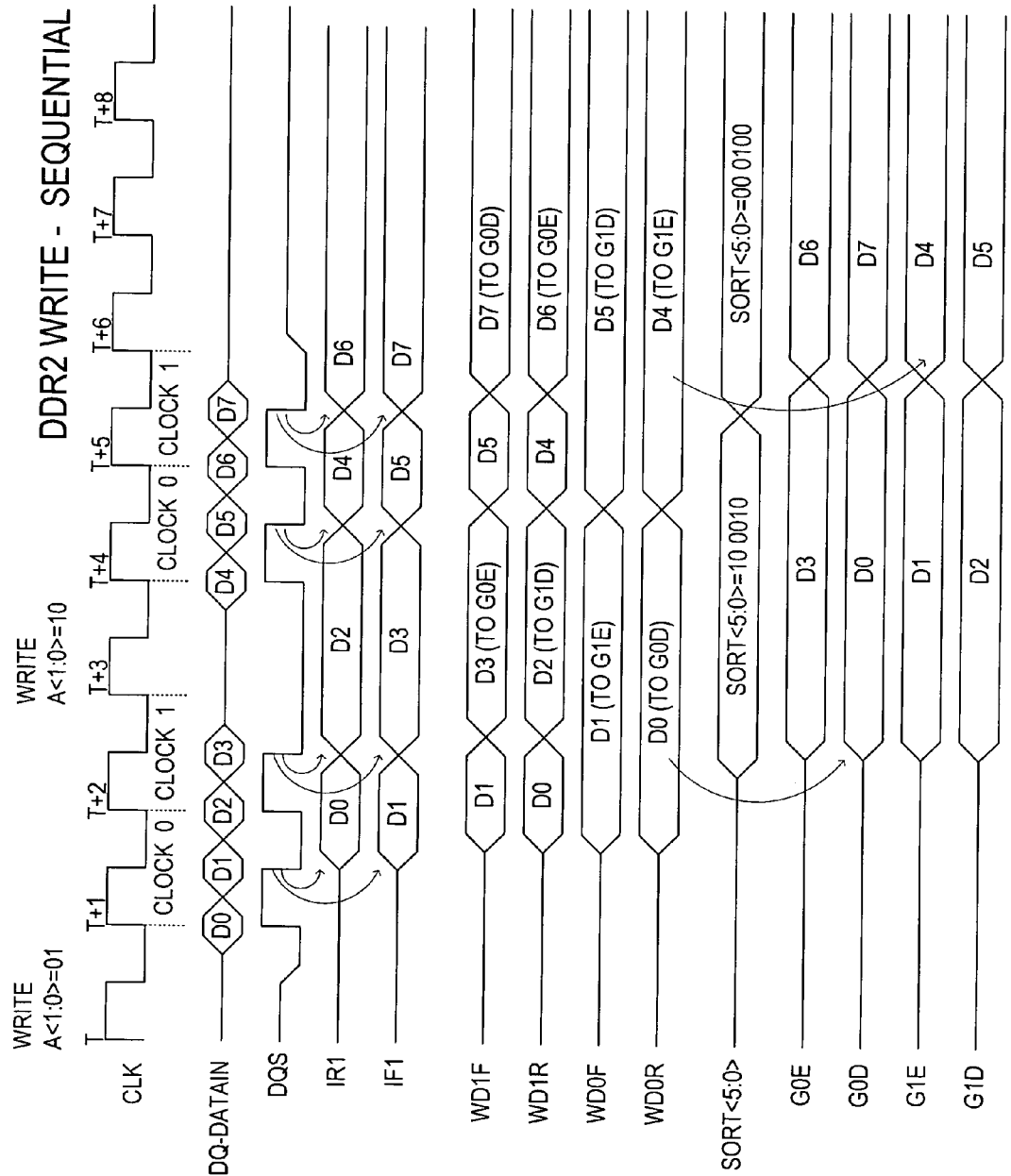

I-lines 138 can also carry the write data. In the embodiment of FIG. 2, only two I-lines are used for the write data. These I-lines are IR1, IF1, but any two I-lines can be chosen. Alternatively, only one I-line can be used for the write data, or all the four I-lines can be used. It is also possible not to use the I-lines for the write data. The scheme of FIG. 2 (using exactly two I-lines) is believed to provide power and timing advantages. The write data is received serially on terminal DQ and latched and amplified by data input buffer 260. Serial-to-parallel converter 270 provides two data items received in one clock cycle to respective lines IR1 (rising edge data), IF1 (falling edge data). S/P converter 270 and circuits 240, 250, 260 are located in a peripheral region of the memory near the DQ terminal. S/P converter 280, located next to the sorting circuit 140 in the middle portion of the memory between the memory banks, performs a 2:4 data conversion. In the example of FIG. 11, four data items D0–D3 were received on terminal DQ in clock cycles T+1 and T+2 (marked as "CLOCK 0" and "CLOCK 1" respectively), on the rising and falling edges of CLOCK 0 and the rising and falling edges of CLOCK 1. When data strobe signal DQS goes low after the rising edge of clock cycle T+1, data D0 and D1 begin to be driven in parallel on respective lines IR1, IF1, and when DQS goes low after the rising edge of clock cycle T+2, data D2 and D3 begin to be driven in parallel on the same lines. Thus, line IR1 carries sequentially the rising edge data D0, D2, and line IF1 carries sequentially the falling edge data D1, D3. Starting some time in clock T+2, S/P converter 280 provides the data D0, D1, D2, D3 in parallel on respective lines WD0R, WD0F, WD1R, WD1F. Sorting circuit 140 transfers these data to lines G0E, G0D, G1E, G1D in parallel in accordance with Table 2. Write buffers in blocks 230 and Y select circuits 130 write the data to the memory cells in parallel.

Mode register 284 stores the burst length and type information, as defined in the DDR2 standard. Address latching circuit 288 latches the input addresses. Clock signal CLK clocks the memory operation. These and other signals are defined in the DDR2 standard.

Figure 3:
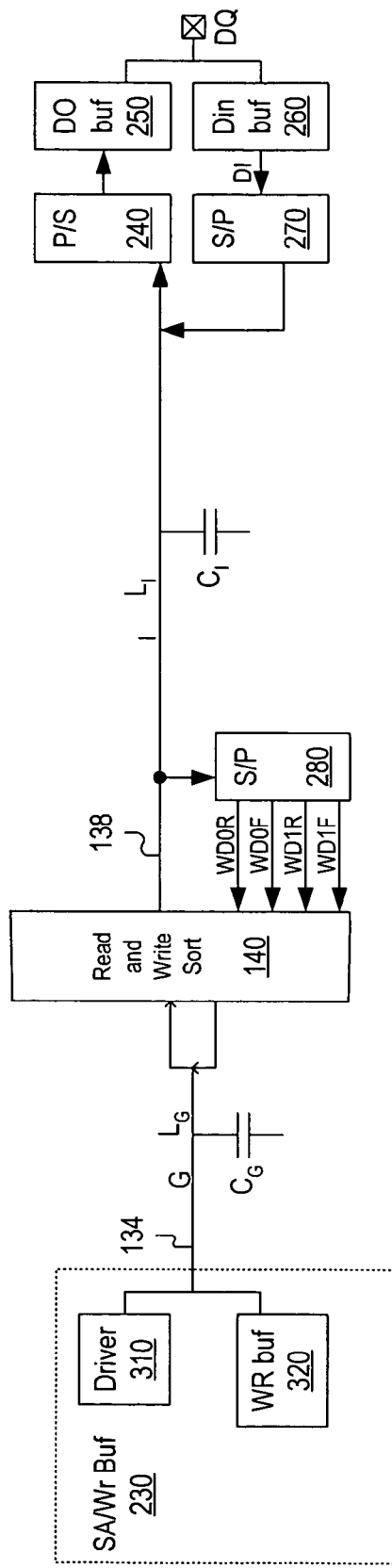

FIG. 3 explains the placement of sorting circuit 140 and S/P converter 280 in some embodiments. The data paths between buffers 230 and terminals DQ are long paths with long RC delays. Sorting circuit 140 and S/P converter 280 are placed in a middle portion of the path, so as to minimize the total RC delay from arrays 110 to terminal DQ. As shown, each G-line 134 has a parasitic capacitance $C_G$ associated with it, and each I-line 138 has a parasitic capacitance $C_I$ associated with it. In some embodiments, each of these capacitances is about 1 pF. $L_G$ denotes the maximum length between a block 230 and sorting circuit 140 along a G-line 138. $L_I$ is the maximum length between the circuits 140, 280 on the one hand and the circuits 240, 270 on the other hand along an I-line 138. In some embodiments, $L_G = L_I$. In some embodiments, $$0.25 * L_G \leq L_I \leq 4 * L_G.$$

Since the G-lines are used both for reading and writing, transistor switches can be provided to connect the G lines to the reading or writing circuitry as needed. Transistor switches can also be provided for the I-lines. Switches can also be used for the two I-lines for some purposes. To minimize the RC delay on each line, the switches are placed as close as possible to the input of a driver that receives signals from the line, and not at the output of a driver that drives the line. In FIG. 3, block 230 includes a sense amplifier driver 310 (a tri-state driver) that drives a G-line 134 in read operations, and also includes an amplifier (e.g. CMOS inverter) 320 that receives the data from the G-line in the write operations. G-line 134 is connected directly to the output of driver 310 and the input of write buffer 320. In some embodiments, the G-line length is at least ¼ of the total length of the conductive write path going through the G-line from the output of buffer 780 to the input of buffer 320. In some embodiments, the G-line length is ½, ¾, or even a greater portion of the total length of the conductive write path.

In the read data path, the G-line is connected to a transistor switch (pass gates 530–542 in FIGS. 5A–5D) positioned adjacent to an input of a driver 554 in sorting circuit 140 but not adjacent to G-line driver 310. The G-line length is at least ¼ of the total length of the conductive read path from the output of driver 310 to a high impedance input of driver 554 (the high impedance input is the gates of transistors, not shown, in CMOS logic gates 560, 564 described below). In some embodiments, the G-line length is ½, ¾, or even a greater portion of the total length of the conductive read path.

Similarly, in some embodiments, the I-lines and/or the WD lines are driven by drivers that have no switches adjacent to their outputs in series with the I-lines and/or the WD lines. Note the I-line drivers 554 in FIGS. 5A–5D for example. Other embodiments use switches in series with these I-lines and/or WD-lines, but the switches are placed near the other end of the lines, e.g. near the end close to an amplifier input. In some embodiments, the length of the I-line or WD-line is at least ¼ of the total length of the conductive path going through the I-line or the WD-line from the driver output to an amplifier input. In some embodiments, the length of the I-line or WD-line is at least ½, ¾, or even a greater portion of the total length of the conductive path going through the I-line or the WD-line from the driver output to an amplifier input.

Figure 4:
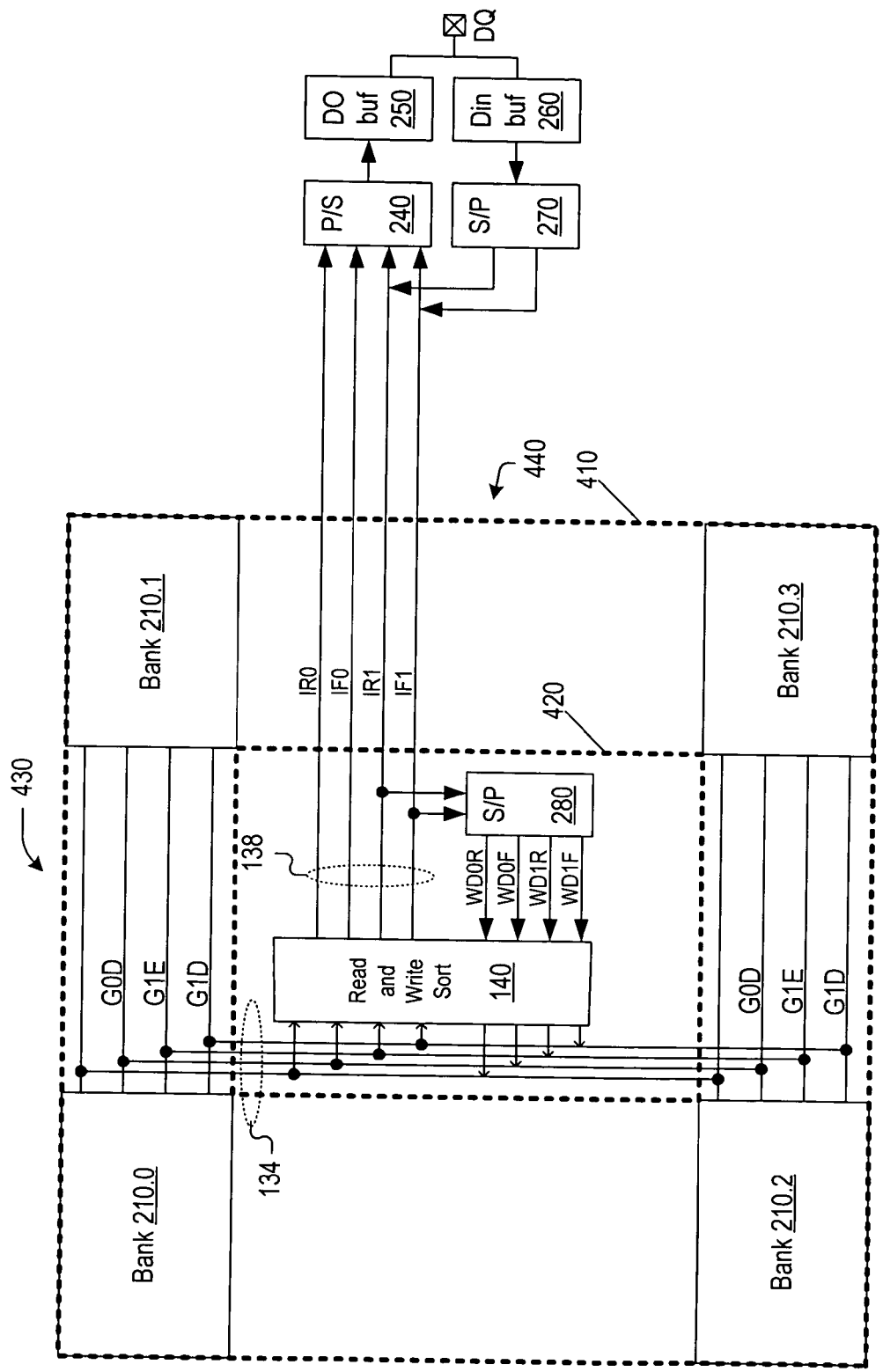

As shown in FIG. 4, the four memory banks 210 define a region 410 which is the smallest rectangular region containing all the four banks. Sorting circuit 140 and S/P converter 280 are located within the region 410. Converters 240, 270 are located outside of this region, in a peripheral region of the memory, next to buffers 250, 260 and terminal DQ. In some embodiments, sorting circuit 140 and S/P converted 280 are located in a central region 420 surrounded by the four memory banks. More particularly, the memory has a region 430 running vertically between the banks 210.0, 210.1 and between the banks 210.2, 210.3. Another region 440 runs horizontally between the banks 210.0, 210.2 and between the banks 210.1, 210.3. Region 420 is the intersection of regions 430, 440.

In some embodiments, the circuits 140, 280 are outside of region 410. Also, a memory may have multiple circuits 140 and/or multiple circuits 280 for different banks 210 or groups of banks. E.g., a memory with eight memory banks may include one circuit 140 and one circuit 280 for each group of four banks. Some or all of circuits 140, 280 may be outside of region 410 (the smallest rectangular region containing all of the eight banks). Also, the DQ terminal may be inside the region 410 or 420. Also, different portions of a circuit 140, 280, or of some circuit may be located in different parts of the memory.

FIGS. 5A–5D illustrate portions of the read sorting circuitry in circuit 140. Circuits 510-R0 (FIG. 5A), 510-F0 (FIG. 5B), 510-R1 (FIG. 5C), 510-F1 (FIG. 5D) drive respective I-lines IR0, IF0, IR1, IF1. These four circuits 510 are identical except for the input signals at the gates of pass gates 530, 534, 538, 542. Each of these circuits 510 includes a multiplexer 520 selecting one of the lines G0E, G0D, G1E, G1D for connection to a node 550 at the input of a tri-state driver 554. Driver 554 drives the respective I-line. MUX 520 consists of four pass gates 530, 534, 538, 542. Each of these pass gates has one source/drain terminal connected to the respective line G0E, G0D, G1E, or G1D, and the other source/drain terminal connected to node 550. The four pass gates connected in parallel provide a low delay data path (one transistor delay). The invention is not limited to this structure however.

Node 550 is connected to one input of two-input NAND 560 and to one input of two-input NOR gate 564 in driver 554. The other inputs of gates 560, 564 receive respective complimentary signals RGICLK, RGICLKB. RGICLK is high during burst reads, and it is low during burst writes to disable the drivers 554. The outputs of gates 560, 564 are connected respectively to the gates of PMOS transistor 566 and NMOS transistor 568. PMOS transistor 566 has its source connected to a voltage source VCC and its drain connected to the respective I-line. NMOS transistor 568 has its drain connected to the I-line and its source connected to ground (or some other reference voltage).

The I-line is also connected to a latch formed by cross-coupled inverters 570, 574.

In some embodiments, all the logic gates (such as gates 560, 564) and the inverters in FIGS. 5A through 11 are CMOS circuitry, but this is not necessary.

Figure 6A:
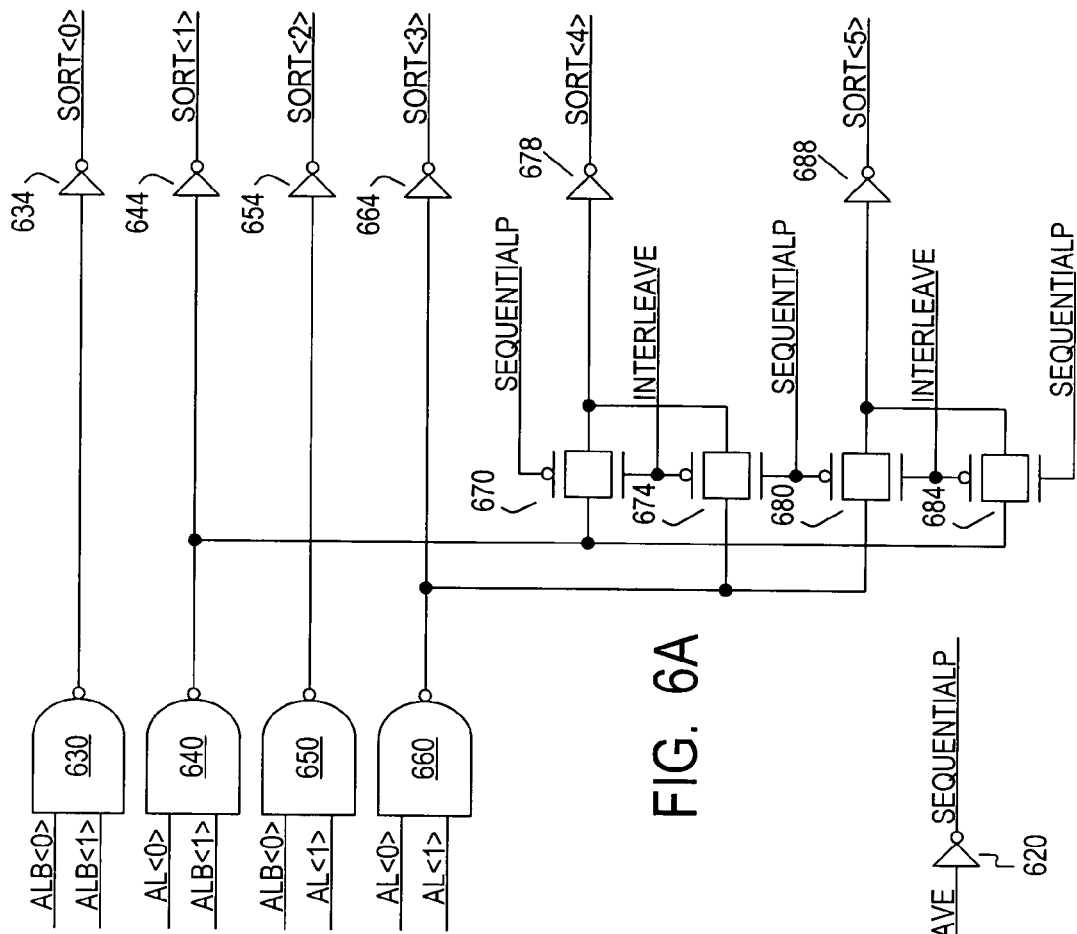
Figure 6B:
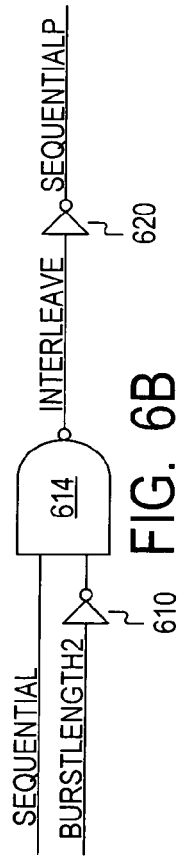

Multiplexers 520 are controlled by signals SORT<0:5> and their complements SORTB<0:5> generated by the circuit of FIGS. 6A, 6B. Each SORT signal is a function of the address bits A<0:1> and the burst length and type signals stored in mode register 284 (FIG. 2). In FIG. 6A, signals AL<1:0> are latched versions of the address signals A<1:0>. Address signals AL<1:0> are generated by latching circuit 288 (FIG. 2) from signals A<1:0> provided in accordance with timing specified in the DDR and DDR2 standards as applicable. Signals ALB<0:1> are the complements of AL<0:1>. In FIG. 6B, the SEQUENTIAL signal is generated from the burst type signal in more register 284. SEQUENTIAL is high (logic 1) if the burst type is sequential. The signal BURSTLENGTH2 is high if the burst length is 2. The DDR2 standard (Table 2) does not provide for the burst length of 2, so BURSTLENGTH2 is low for the DDR2 operation. In some embodiments, the memory also provides the DDR data sequences (Table 1). BURSTLENGTH2 is high in the DDR mode for the burst length of 2. If only the DDR2 operation must be provided, BURSTLENGTH2 can be permanently set to low with a metal option, an electrically or laser programmable fuse, or an electrically programmable cell such as EEPROM.

Signal BURSTLENGHT2 is inverted by inverter 610. The output of inverter 610 and the signal SEQUENTIAL are NANDed by NAND gate 614. The output INTERLEAVE of gate 614 is inverted by inverter 620 to provide a signal SEQUENTIALP. When BURSTLENGTH2 is low, signal INTERLEAVE is the complement of SEQUENTIAL, and SEQUENTIALP is the logic equivalent of SEQUENTIAL. When BURSTLENGTH2 is high, INTERLEAVE is also high and SEQUENTIALP is low. As shown in Table 1, the burst type is "don't care" for the burst length of 2.

The SORT signals asserted for a given A1A0 value and a given burst length are shown in Table 3 below. The last two columns show which of the SORT signals are asserted (high). The remaining SORT signals are low.

TABLE 3

SORT SIGNALS

| BURST LENGTH | STARTING ADDRESS A1 A0 | SORT SIGNALS ASSERTED | |
|---|---|---|---|
| | | Interleaved | Sequential |
| 2 (DDR only) | 00 | SORT<0> | SORT<0> |
| | 01 | SORT<1> & SORT<4> | SORT<1> & SORT<4> |
| | 10 | SORT<2> | SORT<2> |
| | 11 | SORT<3> & SORT<5> | SORT<3> & SORT<5> |
| 4 or 8 (DDR or DDR2) | 00 | SORT<0> | SORT<0> |
| | 01 | SORT<1> & SORT<4> | SORT<1> & SORT<5> |
| | 10 | SORT<2> | SORT<2> |
| | 11 | SORT<3> & SORT<5> | SORT<3> & SORT<4> |

The circuit of FIG. 6A is one possible implementation of Table 3. Address signals ALB<0>, ALB<1> are ANDed by NAND gate 630 and inverter 634 to provide SORT<0>. Signals AL<0>, ALB<1> are ANDed by NAND gate 640 and inverter 644 to provided SORT<1>. Signals ALB<0>, AL<1> are ANDed by NAND gate 650 and inverter 654 to provide SORT<2>. Signals AL<0>, AL<1> are ANDed by NAND gate 660 and inverter 664 to provide SORT<3>. Pass gates 670, 674 are configured as a multiplexer selecting the output of gate 640 when INTERLEAVE is high, and the output of gate 660 when INTERLEAVE is low (when SEQUENTIALP is high). The multiplexer output is inverted by inverter 678 to provide SORT<4>. Pass gates 680, 684 are configured as a multiplexer selecting the output of gate 660 when INTERLEAVE is high, and the output of gate 640 when INTERLEAVE is low. The multiplexer output is inverted by inverter 688 to provide SORT<5>.

Signals SORTB<0:5> are obtained by inverting SORT<0:5> with inverters (not shown).

Figure 5D:
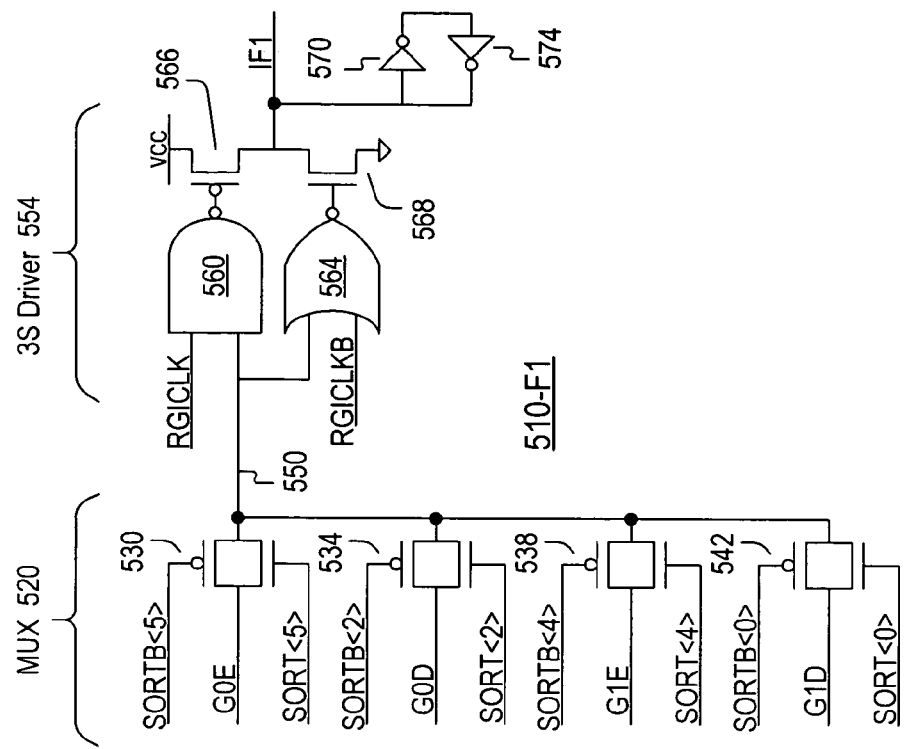
Figure 5C:
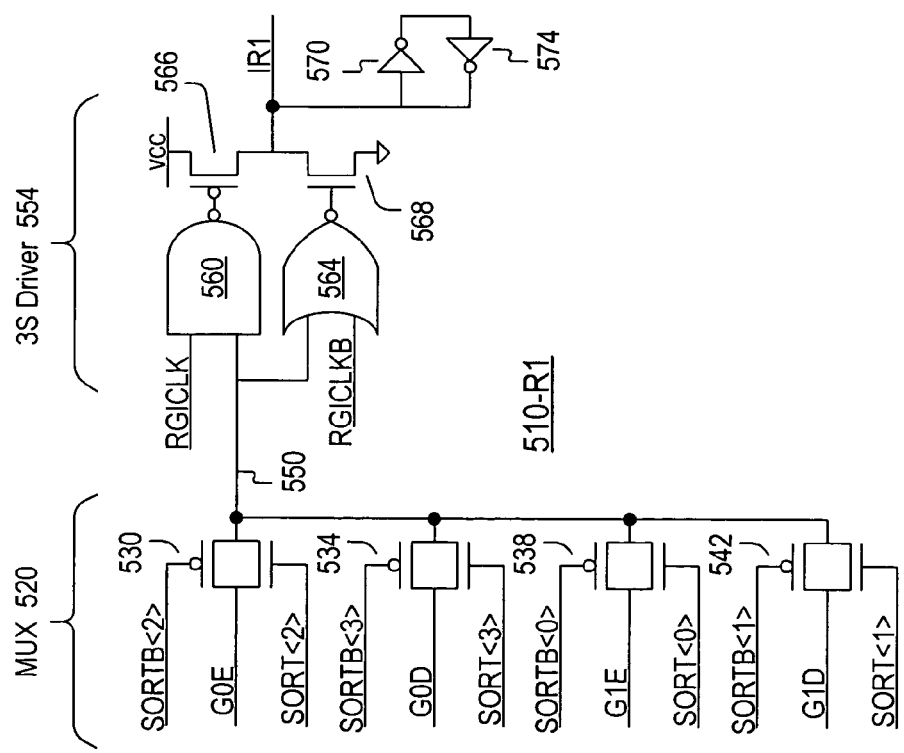

In FIG. 5A, pass gate 530 is closed (conducting) when SORT<0> is high, and the pass gate is open otherwise. Pass gate 534 is closed when SORT<1> is high, and the pass gate is open otherwise. Pass gates 538, 542 are closed if when the respective signals SORT<2>, SORT<3> are high, and the pass gates are open otherwise. In FIG. 5B, pass gates 530, 534, 538, 542 are closed when the respective signals SORT<4>, SORT<0>, SORT<5>, SORT<2> are high, and the pass gates are open otherwise. In FIG. 5C, pass gates 530, 534, 538, 542 are closed when the respective signals SORT<2>, SORT<3>, SORT<0>, SORT<1> are high, and the pass gates are open otherwise. In FIG. 5D, pass gates 530, 534, 538, 542 are closed when the respective signals SORT<5>, SORT<2>, SORT<4>, SORT<0> are high, and the pass gates are open otherwise.

If the memory has multiple DQ terminals, e.g. N such terminals, each circuit 510 may contain a multiplexer circuit consisting of N multiplexers 520. Each multiplexer will be identical to a respective multiplexer 520 of FIG. 5A, 5B, 5C or 5D except for its data inputs and outputs. For example, in the case of FIG. 5A, N lines IR0<0:N-1> can be provided, one line for each DQ terminal. Likewise, there can be N lines G1E<0:N-1>, N lines G0D<0:N-1>, N lines G1E<0:N-1>, and N lines G1D<0:N-1>. The circuit 510-R0 will have N multiplexers 520, which can be labeled, for example, as 520.0, ... 520.N-1. Each multiplexer 520.i will select one of the lines G0E<i>, G0D<i>, G1E<i>, G1D<i> and will couple the selected line to the line IR0<i>. All the multiplexers 520.i will receive the same SORT signals as in FIG. 5A.

FIGS. 7A–7D illustrate portions of the write sorting circuitry in circuit 140. The circuitry is controlled by the SORT signals (FIG. 6A), and the Table 3 above applies to both the read and the write operations. Circuits 710-0E (FIG. 7A), 710-0D (FIG. 7B), 710-1E (FIG. 7C), 710-1D (FIG. 7D) drive respective G-lines G0E, G0D, G1E, G1D. These four circuits 710 are identical except for the input signals at the gates of pass gates 730, 734, 738, 742. Each of these circuits 710 includes a multiplexer 720 selecting one of the lines WD0R, WD0F, WD1R, WD1F (FIG. 2). MUX 720 consists of four pass gates 730, 734, 738, 742. Each of these pass gates has one source/drain terminal connected to the respective line WD0R, WD0F, WD1R, or WD1F, and the other source/drain terminal connected to the multiplexer output node 750. The four pass gates connected in parallel provide a low delay data path (one transistor delay). The invention is not limited to this structure however.

The signal on node 750 is inverted by inverter 764. The output of inverter 764 is connected to a source/drain terminal of pass gate 768. Pass gate 768 is closed when a signal GWENL is high, and is open otherwise. Signal GWENL is used to capture and latch data following the write command in a clock cycle defined by the write latency defined by mode register 284 of FIG. 2 (the write latency is the CAS latency minus one clock cycle in DDR2). The signal L- at the PMOS gate of pass gate 768 is the inverse (the complement) of signal GWENL. The other source/drain terminal of pass gate 768 is connected to one terminal of a latch consisting of cross coupled inverters 772, 776. The other latch terminal is the input of a tri-state driver 780. Driver 780 drives the respective G-line G0E, G0D, G1E, or G1E when signal GWDRV is high. Driver 780 is disabled (high impedance) when GWDRV is low. In the driver, the signal from the latch 772, 776 is provided to one input of two-input NAND 784 and one input of two-input NOR gate 788. The other inputs of gates 784, 788 receive respective complimentary signals GWDRV, DRV-. The outputs of gates 784, 788 are connected respectively to the gates of PMOS transistor 792 and NMOS transistor 796. PMOS transistor 792 has its source connected to voltage source VCC and its drain connected to the respective G-line. NMOS transistor 796 has its drain connected to the G-line and its source connected to ground (or some other reference voltage).

In FIGS. 7A–7D, the sorting circuits 710 receive the same two signals GWENL, GWDRV and their complements. In another embodiment, a separate pair of the GWENL, GWDRV signals is provided to each individual circuit 710, to allow selective enabling of some of the circuits 710 while disabling the remaining circuits 710. This is done to save power in the DDR operation described below in connection with Tables 4 and 5. The DDR operation has a prefetch of 2, so only two of the G-lines are needed to carry the write data, as described below.

Figures 7A, 7B:
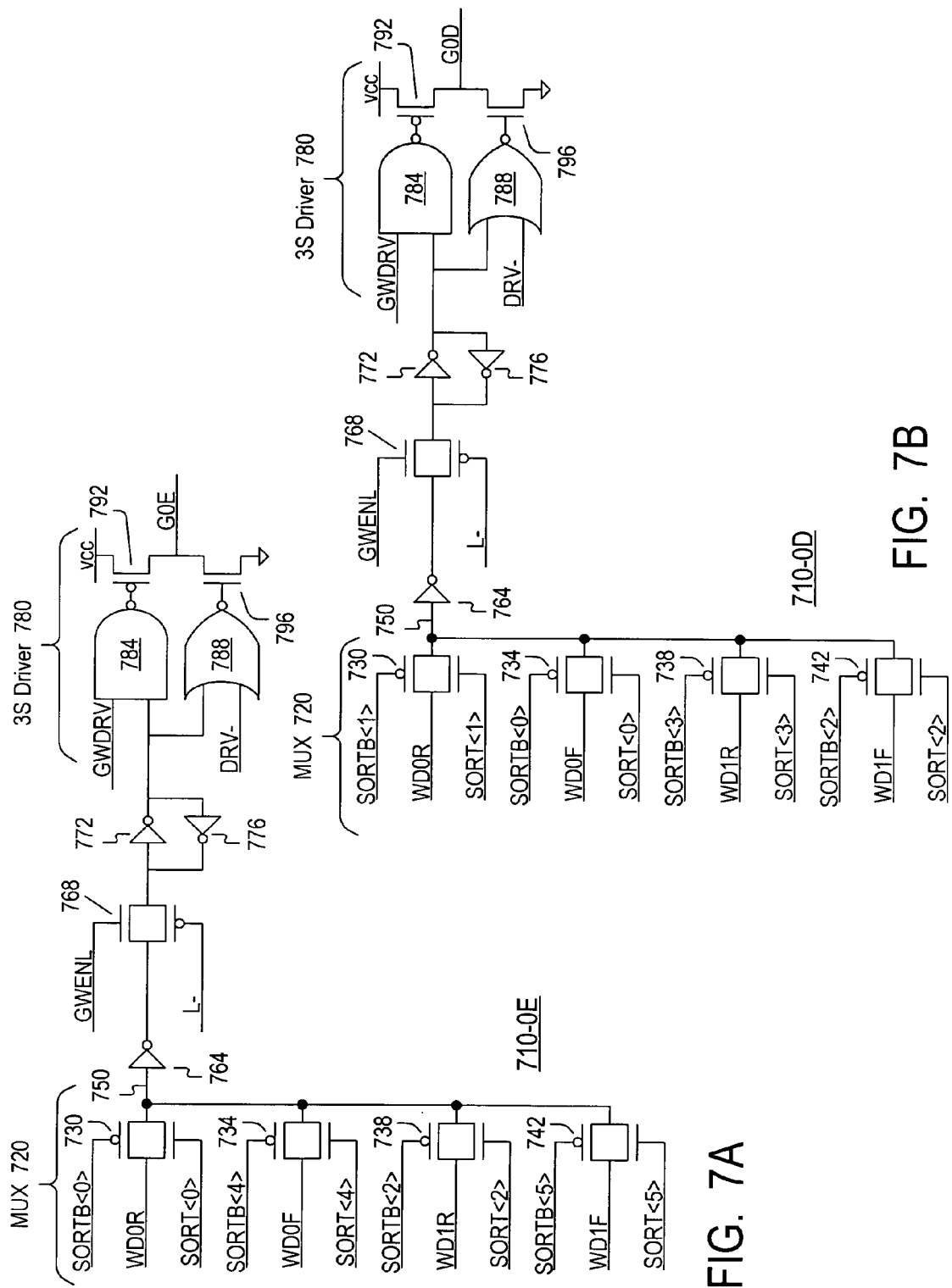
Figures 7C, 7D:
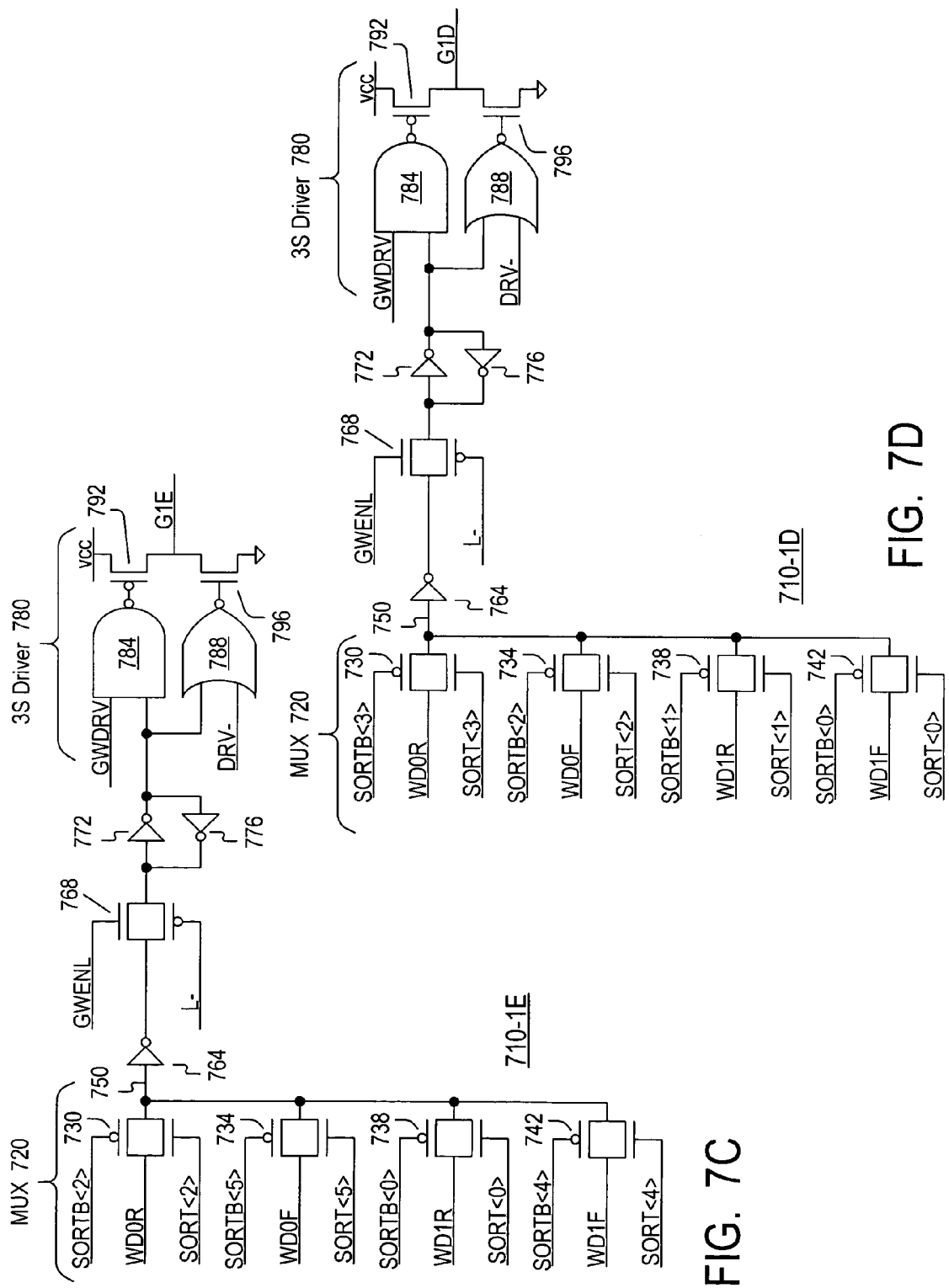

In FIG. 7A, pass gate 730 is closed when SORT<0> is high, and the pass gate is open otherwise. Pass gate 734 is closed when SORT<4> is high, and the pass gate is open otherwise. Pass gates 738, 742 are closed when the respective signals SORT<2>, SORT<5> are high, and the pass gates are open otherwise. In FIG. 7B, pass gates 730, 734, 738, 742 are closed when the respective signals SORT<1>, SORT<0>, SORT<3>, SORT<2> are high, and the pass gates are open when these respective signals are low. In FIG. 7C, pass gates 730, 734, 738, 742 are closed when the respective signals SORT<2>, SORT<5>, SORT<0>, SORT<4> are high, and the pass gates are open otherwise. In FIG. 7D, pass gates 730, 734, 738, 742 are closed when the respective signals SORT<3>, SORT<2>, SORT<1>, SORT<0> are high, and the pass gates are open otherwise.

If the memory has multiple DQ terminals, e.g. N such terminals, each circuit 710 may contain a multiplexer circuit consisting of N multiplexers 720. Each multiplexer will be identical to a respective multiplexer 720 of FIG. 7A, 7B, 7C or 7D except for its data inputs and outputs. For example, in the case of FIG. 7A, N lines G1E<0:N-1> can be provided, one line for each DQ terminal. Likewise, there can be N lines WD0R<0:N-1>, N lines WD0F<0:N-1>, N lines WD1R<0:N-1>, and N lines WD1F<0:N-1>. The circuit 710-0E will have N multiplexers 720, which can be labeled, for example, as 720.0, ... 720.N-1. Each multiplexer 720.i will 'select one of the lines WD0R<i>, WD0F<i>, WD1R<i>, WD1F<i> and will couple the selected line to the line G1E<i>. All the multiplexers 720.i will receive the same SORT signals as in FIG. 7A.

FIGS. 8A–8D illustrate one embodiment of S/P converter 270. Signal DQS (FIGS. 8B, 8D) is an input data strobe. The data on terminal DQ are latched by buffer 260 on each edge of DQS, as defined in the DDR2 standard and shown in FIG. 8D. Signal CLK as a clock signal, called CK in the DDR2 standard. The DQ data provided on the rising CLK edge are latched when DQS is high, and data provided on the falling CLK latch are latched when DQS is low. D1 (FIG. 8A) is the output of buffer 260 (FIG. 2).

Figure 8A:
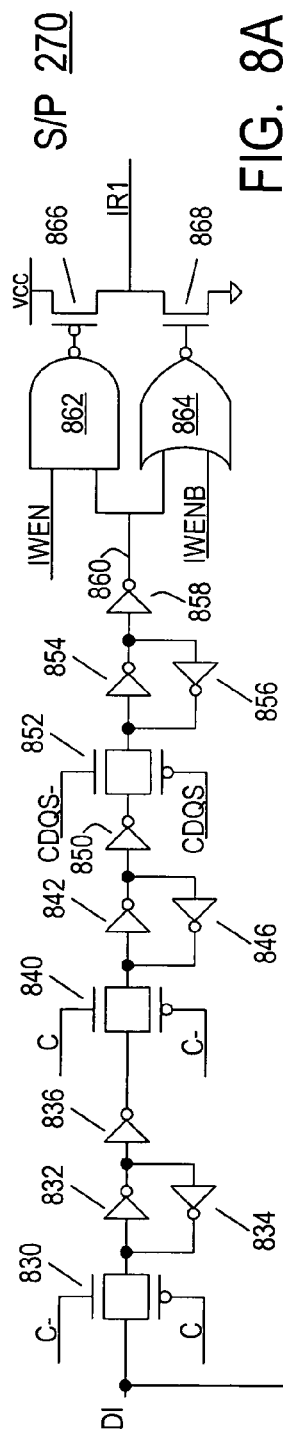
Figure 8B:
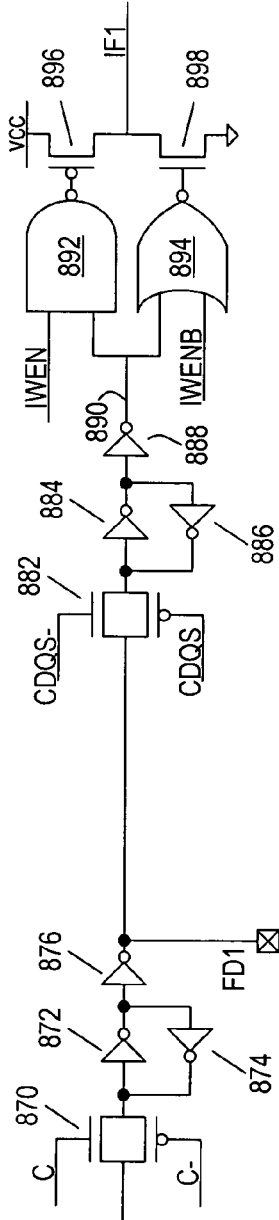
Figure 8C:
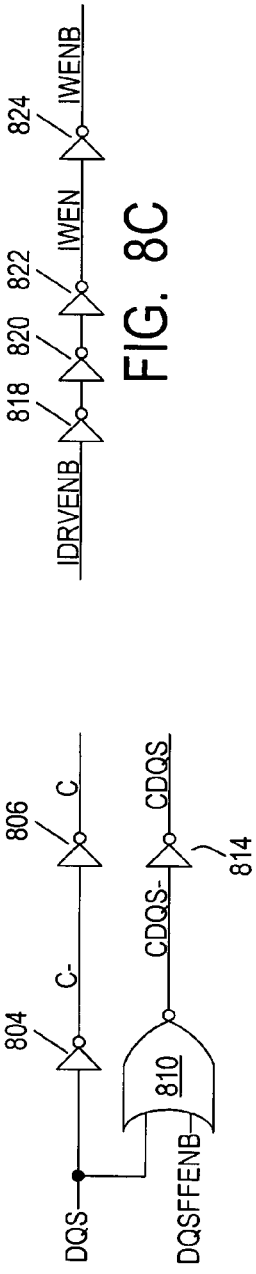
Figure 8D:
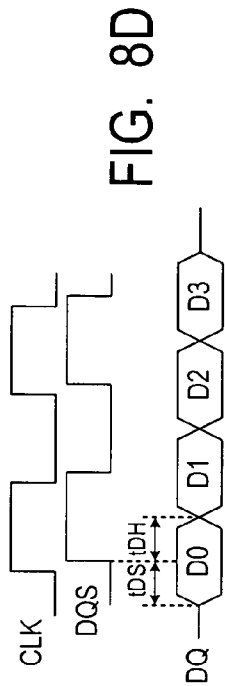

The circuits of FIGS. 8B, 8C generate control signals for the circuit of FIG. 8A. As shown in FIG. 8B, the DQS signal is inverted by inverter 804 to provide a signal C- on the inverter output. Signal C- is inverted by inverter 806 to provide a signal C. Signal DQSFFENB is asserted (active low) to enable DQS latching by the memory. The DQS latching circuitry is not shown. DQSFFENB and DQS are NORed by NOR gate 810 to provide a signal CDQS-. CDQS- is inverted by inverter 814 to provide CDQS ("controlled DQS").

Signal IDRVENB (FIG. 8C) is a logic equivalent of DQSFFENB. IDRVENB is provided to an input of a chain of serially connected inverters 818, 820, 822, 824. The output signal of inverter 822 is labeled IWEN. The output signal of inverter 824 is labeled IWENB.

In FIG. 8A, the input DI is connected to one source/drain terminal of pass gate 830. The pass gate is closed when C is low, to pass a data item that was received on the DQ terminal when DQS was high (as can be seen in FIG. 8B, due to inverters 804, 806 there is a time delay between DQS and C). The other source/drain terminal of pass gate 830 is connected to one terminal of a latch consisting of cross-coupled inverters 832, 834. The other terminal of the latch is connected to the input of inverter 836. The inverter output is connected to a source/drain terminal of pass gate 840 which is closed when C is high. The other source/drain terminal of pass gate 840 is connected to one terminal of a latch consisting of cross-coupled inverters 842, 846. The other terminal of the latch is connected to the input of inverter 850. The inverter output is connected to one source/drain terminal of pass gate 852 which is closed when CDQS is low. The other source/drain terminal of the pass gate is connected to one terminal of a latch consisting of cross-coupled inverters 854, 856. The other latch terminal is connected to the input of inverter 858. The inverter output 860 is connected to the input of a tri-state driver driving the line IR1 when IWEN is high. The driver is disabled when IWEN is low. The driver includes a NAND gate 862 which NANDs the signal on node 860 with the signal IWEN, and a NOR gate 864 which NORs the signal on node 860 with IWENB. The outputs of gates 862, 864 are connected to the respective gates of PMOS transistor 866 and NMOS transistor 868. PMOS transistor 866 has its source connected to VCC and its drain connected to line IR1. NMOS transistor 868 has its drain connected to line IR1 and its source connected to ground.

Input DI is connected to one source/drain terminal of pass gate 870. The pass gate is closed when C is high, to enable latching of a data item that was received on the DQ terminal when DQS was low. The other source/drain terminal of pass gate 870 is connected to one terminal of a latch consisting of cross-coupled inverters 872, 874. The other terminal of the latch is connected to the input of inverter 876. The inverter output is connected to a source/drain terminal of pass gate 882 which is closed when CDQS is low. The other source/drain terminal of the pass gate is connected to one terminal of a latch consisting of cross-coupled inverters 884, 886. The other latch terminal is connected to the input of inverter 888. The inverter output 890 is connected to the input of a tri-state driver driving the line IF1 when IWEN is high. The driver is disabled when IWEN is low. The driver includes a NAND gate 892 which NANDs the signal on node 890 with the signal IWEN, and a NOR gate 894 which NORs the signal on node 890 with IWENB. The outputs of gates 892, 894 are connected to the respective gates of PMOS transistor 896 and NMOS transistor 898. PMOS transistor 896 has its source connected to VCC and its drain connected to line IF1. NMOS transistor 898 has its drain connected to line IF1 and its source connected to ground.

When DQS becomes high and then becomes low, two bits of the DQ data received on the respective rising and falling CLK edges are driven on the respective lines IR1, IF1. See the timing diagram in FIG. 11.

Figure 9A:
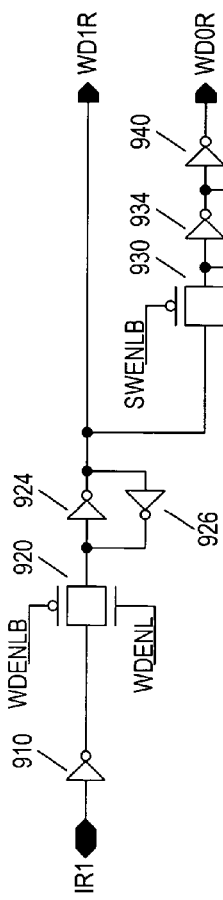
Figure 9B:
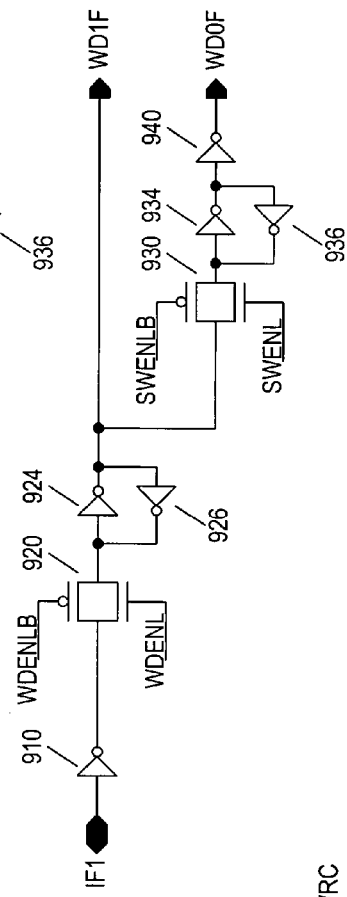
Figure 9C:
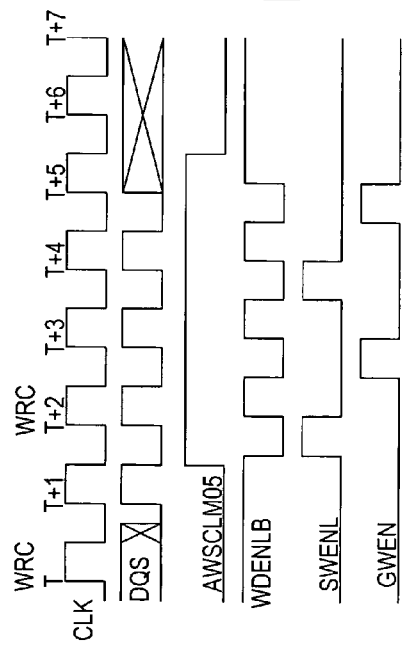
FIGS. 9C, 10, 11 are timing diagrams of memory signals according to embodiments of the present invention.

FIGS. 9A–9C illustrate S/P converter 280. FIG. 9A shows a data path from line IR1 to lines WD0R, WD1R. FIG. 9B shows a data path from line IF1 to lines WD0F, WD1F. The two data paths are identical circuits controlled by signals WDENL, SWENL, and their complements WDENLB, SWENLB. These signals are described below. In each of FIGS. 9A, 9B, the I-line IR1 or IF1 is connected to the input of inverter 910. The inverter output signal passes through pass gate 920 closed when WDENL is high, to one terminal of a latch formed by cross-coupled inverters 924, 926. The other terminal of the latch is connected to respective line WD1R or WD1F. This terminal is also connected to one source/drain terminal of pass gate 930 closed when SWENL is high. The other source/drain terminal of the pass gate is connected to one terminal of a latch formed by cross-coupled inverters 934, 936. The other terminal of the latch is connected to the input of inverter 940 whose output is connected to respective line WD0R or WD0F.

The WDENL signal is driven high to couple the lines IR1, IF1 to the WD lines. In each burst write operation, SWENL is driven high for the first two data items of the burst, i.e. items D0, D1 in FIG. 11, so that D0 is driven on WD0R and WD1R and D1 is driven on WD0F and WD1F. SWENL is low for the next two data items D2, D3 so that D2 is driven on WD1R and D3 is driven on WD1F while the items D0, D1 continue to be driven on WD0R, WD0F. If the burst length is 8 to write consecutive data D0–D7, SWENL is high for D4, D5 and low for D6, D7. As a result, D4 is initially driven on WD0R, WD1R, and D5 is initially driven on WD0F, WD1F, but then D6 and D7 overwrite D4 and D5 on the respective lines WD1R, WD1F so that the four data items D4–D7 are driven on the respective lines WD0R, WD0F, WD1R, WD1F in parallel.

FIG. 9C shows burst write signal timing for two bursts of burst length 4 and write latency 1 as defined in the DDR2 standard. A write command (WRC) is issued on the rising edge of a clock cycle T, and another write command is issued on the rising edge of clock cycle T+2. For the write command in cycle T, DQS is active in cycles T+1 and T+2 to enable the writing of two data items (the burst length is 4). Signal AWSCLM05 is driven high in write burst operations. WDENL=(NOT CLK) AND AWSCLM05.

Figure 10:
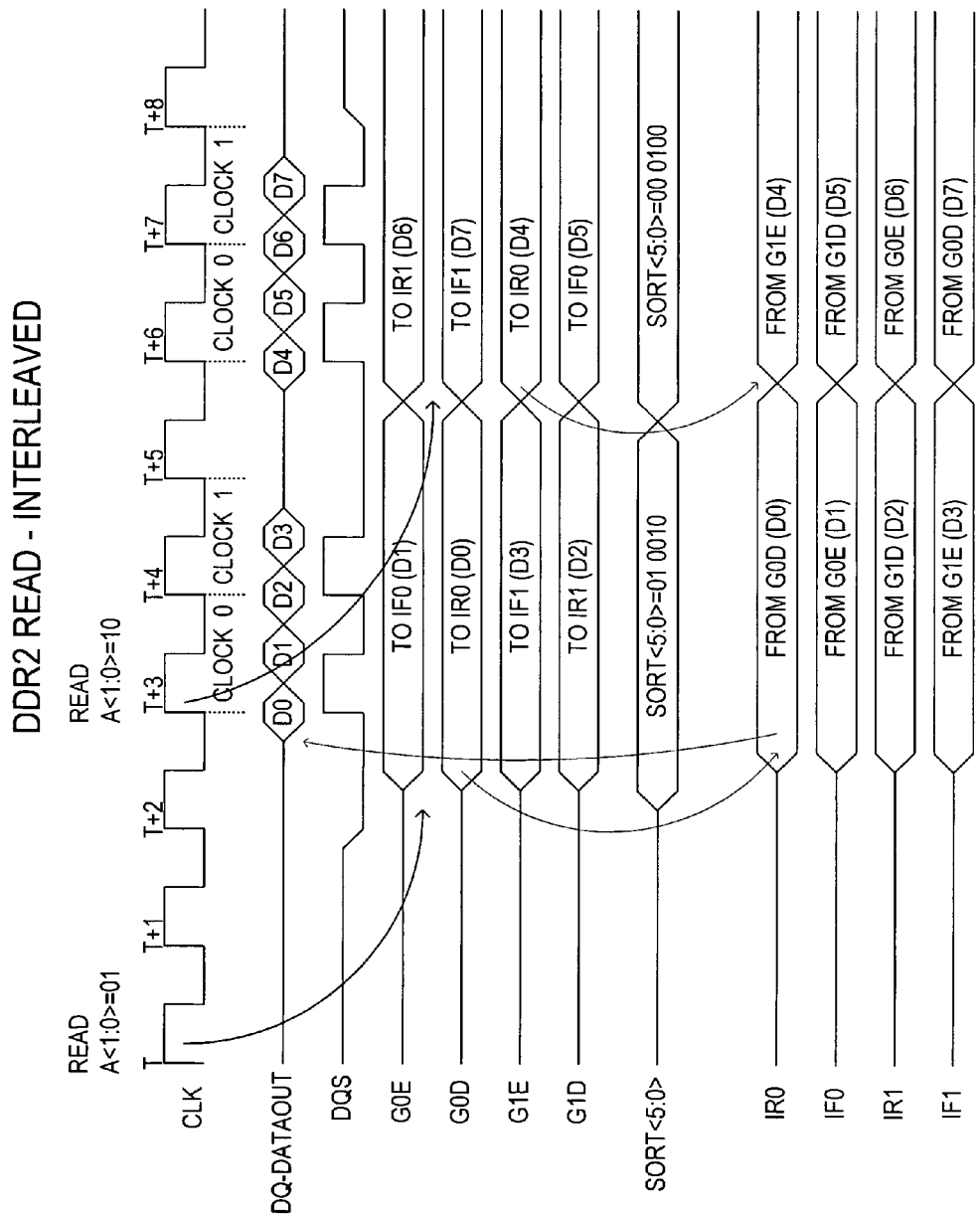

FIG. 10 is a timing diagram of two consecutive interleave read operations with a burst length of 4. DATA0UT is the DQ signal. A read command is issued in a clock cycle T with A<1:0>=01. Four data items D0–D3 are read out in parallel from one of the memory banks 210 and driven on the G-lines as a result of the read command. The SORT signals become valid around the same time that the data are driven onto the G-lines. D0–D3 are transferred in parallel to the I-lines, and then read out to the DQ terminal on the edges of clocks T+3 and T+4. DQS is driven high for the rising edge data, and low for the falling edge data, in accordance with the DDR2 standard.

Another read command is issued in clock cycle T+3 with A<1:0>=10. The read operation timing is the same as for the previous read.

FIG. 11 is a timing diagram of two consecutive burst write operations for a sequential burst type and a burst length of 4. DATA1N is the DQ signal. A write command is issued in a clock cycle T with A<1:0>=01. Four data items D0–D3 are latched from the DQ terminal on the rising and falling edges of clocks T+1, T+2 synchronously with the DQS signal, as specified in the DDR2 standard. Upon the falling edge of the DQS signal after the rising edge of clock cycle T+1, data items D0, D1 are driven on respective lines IR1, IF1 as described above, and then on respective lines WD0R, WD0F. Upon the falling edge of the DQS signal after the rising edge of clock cycle T+2, data items D2, D3 are driven on respective lines IR1, IF1, and then on respective lines WD1R, WD1F. The SORT signals become valid in cycle T+2, and the data are transferred to the G-lines and written to one of the memory banks. Another write command is issued in cycle T+3 with A<1:0>=10, and is performed with a similar timing.

Figure 12:
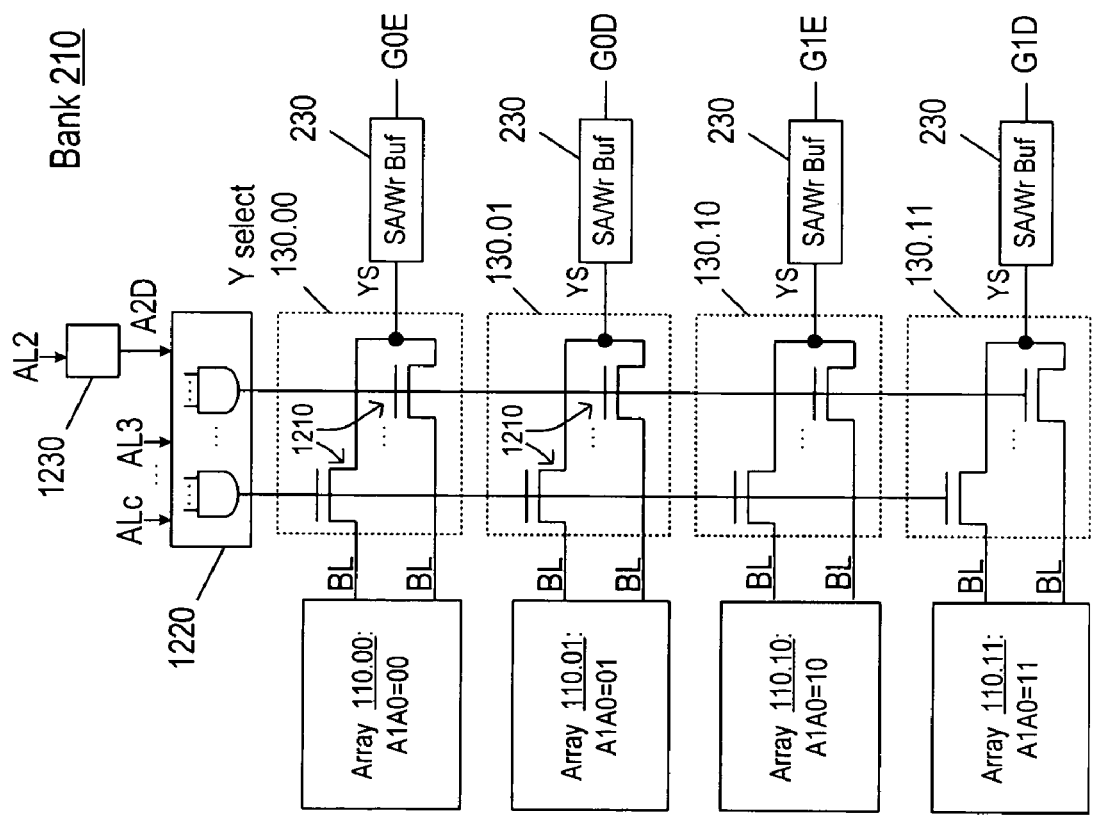
FIGS. 12, 13 are block an circuit diagrams of memory circuits according to embodiments of the present invention.
Figure 13:
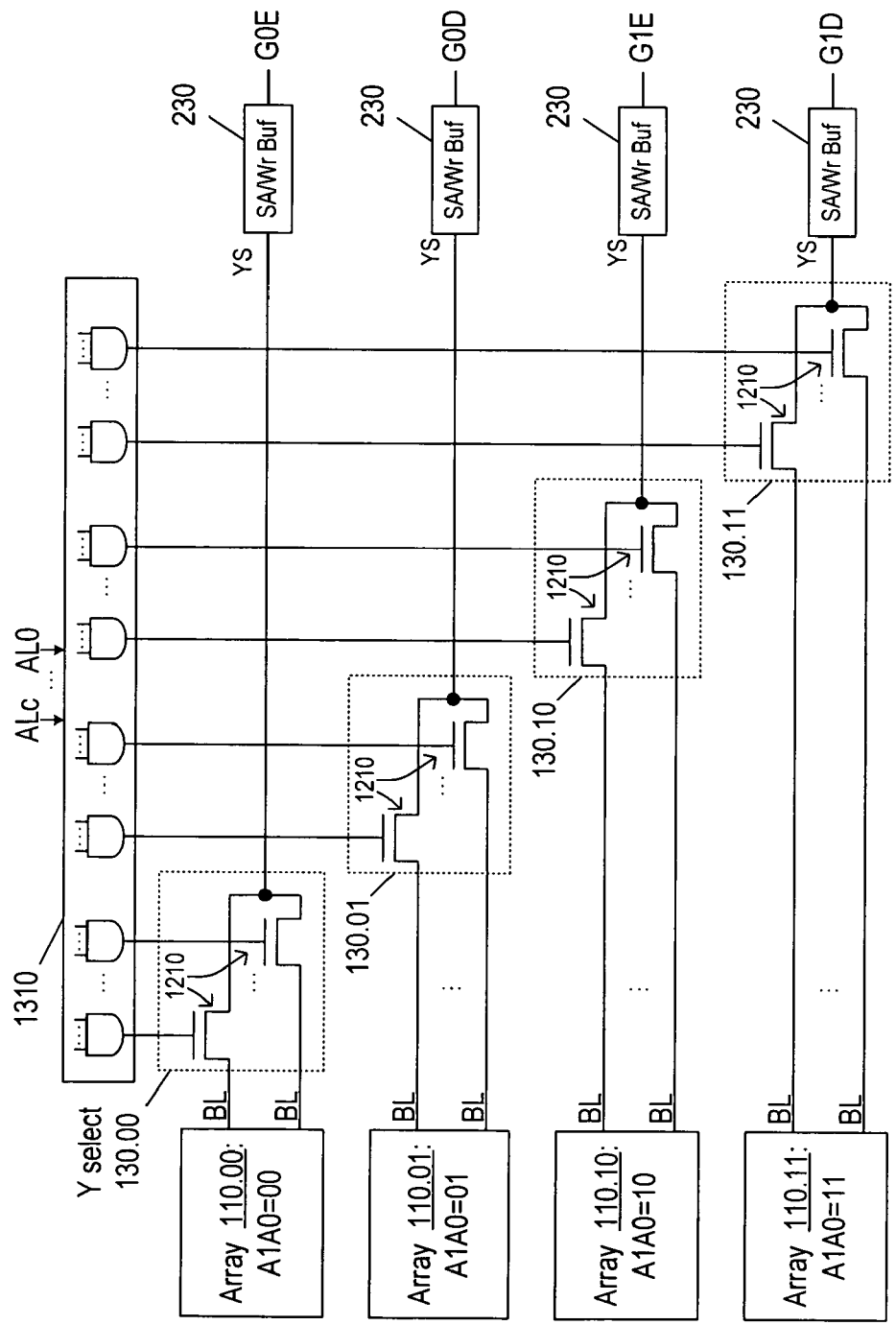

FIG. 12 is a block diagram of Y select and decoding circuitry suitable for the DDR2 functionality. FIG. 13 is a block diagram of Y select and decoding circuitry suitable for a memory providing both the DDR2 and the DDR functionality. Identical circuits can be used for the four memory banks, and only one memory bank is shown. Y select circuit 130 includes four circuits 130.00, 130.01, 130.10, 130.11 for the respective arrays 110.00, 110.01, 110.10, 110.11. Each of these circuits 130.*ij* has pass transistors 1210 coupling the bitlines BL of the respective array to the respective line YS. The column address is denoted as A<c:0>, and its latched version as AL<c:0>. The memory bank 210 is selected by the row address. Bits AL<1:0> select an array 110.*ij* out of the four arrays of the memory bank. The remaining bits AL<c:2> select a column within the array. The column contains one bitline or a pair of bitlines for each DQ terminal. In FIG. 12, the columns having the same column address within the four arrays are activated simultaneously, so the gates of the pass transistors for these columns are tied together. Thus, each output of Y decoder 1220 is shown connected to four pass transistor gates in the respective four circuits 130.00–130.11. Y decoder 1220 receives column address signals AL<c:3> and a signal A2D generated by circuit 1230 from column address signal AL2 (i.e. AL<2>). If the DDR2 burst length is 4, then A2D=AL2. If the burst length is 8, then A2D=AL2 for the prefetch of the first four data items (i.e. when the first four data items are being transferred between the arrays 110 and the G-lines), and A2D is the inverse of AL2 for the prefetch of the last four data items. Y decoder 1220 includes a number of AND gate circuits that perform AND operations on groups of address signals and their compliments in a known in the art. The Y decoder outputs are connected to the gates of pass transistors 1210 as shown.

FIG. 13 shows the Y circuitry suitable for both the DDR2 operation (Table 2, prefetch of 4) and the DDR operation (Table 1, prefetch of 2). In the DDR mode, only two of arrays 110.*ij* are accessed at a time, and further the DDR sequential type bursts of burst length 8 may require simultaneous activation of columns with different address bits A<c:2>. Therefore, the gates of pass transistors 1210 in different circuits 130.*ij* are not tied together. Y decoder circuit 1310 generates the signals for the gates of pass transistors 1210 from the address bits AL<c:2>. In the DDR2 operation, the same signals can be generated as in FIG. 12. In the DDR operation, the signals are generated as defined by Table 1 and explained immediately below.

In the DDR burst read operation, two data items are read from two of the arrays 110.*ij* in the selected bank to the respective G-lines. Sorting circuit 140 (FIGS. 2, 5A–7D) transfers the data items to the lines IR0, IF0 in accordance with Table 1. P/S converter 240 converts the data to the serial format, and DO buffer 250 sequentially provides the data on the DQ terminal on the rising and falling edges of a clock cycle synchronously with the DQS signal, as defined in the DDR standard.

In a burst write operation, buffer 260 latches the data item pairs received on a rising and falling clock edges. S/P converter 270 drives each data item pair on the lines IR1 (rising edge data), IF1 (falling edge data). In S/P 280 (FIGS. 9A, 9B), the signal SWENL is forced DC high in the DDR operation. Therefore, the rising edge data item is driven on both lines WD0R, WD1R, and the falling edge data item is driven on both lines WD0F, WD1F. Because each data item is provided on two of the lines, the design of sorting circuit 140 is simplified, and in particular the same SORT signals can be used for the DDR and DDR2 operation for the burst lengths of 4 and 8 as shown above in Table 3.

Tables 4 and 5 below show how the data are transferred from the WD lines to the G-lines for the DDR operation. The first column (Burst Length) is the same as in Table 1. In the second column (A1A0, Data Sequence, or A2A1A0, Data Sequence), A1A0 or A2A1A0 is the starting address. The Data Sequence is as in the last two columns (data sequence columns) in Table 1. Table 4 includes the interleaved type data sequences, and Table 5 the sequential type sequences.

The last five columns show the correspondence between the WD lines and the G-lines in different prefetch clock cycles. A prefetch clock cycle is a cycle in which the data are transferred between the arrays 110 and the G-lines. If the burst length is 2, only one prefetch cycle CLK0 is present. For the burst length of 4, two prefetch clock cycles CLK0 and CLK1 are present. For the burst length of 8, four prefetch cycles CLK0, CLK1, CLK2, CLK3 are present.

For the burst length of 2, starting address A1A0=00, the data sequence is 0-1. The data from lines WD0R, WD0F, WD1R, WD1F are transferred to the respective lines G0E, G0D, G1E, G1D as defined by the SORT signals (Table 3 and FIGS. 6A–7D). In the data sequence 0-1, the line G1E carries the data item 0, and G0D carries data item 1. This is shown as G0E(0), G0D(1) in Tables 4 and 5. The lines G1E, G1D will not be coupled to the arrays due to the action of the Y circuitry (FIG. 13). This is shown as G1E(none), G1D(none).

For A1A0=01, the operation is similar. For A1A0=10, the data sequence is shown as "2-3" instead of "0-1" because A1=1. The correspondence between the WD lines and the G-lines is the same as for A1A0=0, but this time the data from lines G1E (item 2) and G1D (item 3) is written to the arrays. Lines G0E, G0D carry the same data (because the lines WD0R, WD0F carry the same data as WD1R, WD1F) but lines G1E, G0D are not coupled to the arrays by the Y circuitry.

For A1A0=11, the operation is similar. The burst length 2 entries are the same in Tables 4 and 5.

For the burst length of 4 in Table 4, A1A0=00, the lines WD0R, WD0F, WD1R, WD1F are coupled to respective lines G0E, G0D, G1E, G1D. In clock CLK0, lines G0E (data sequence item 0) and G0D (item 1) are coupled to the respective arrays 110.00 and 110.01. In clock CLK1, lines G1E (item 2) and G1D (item 3) are coupled to the respective arrays 110.10, 110.11. The operation for the remaining starting addresses is similar. Lines G0E, G0D, G1E, G1D always carry the respective items 0, 1, 2, 3 of the data sequence.

For the burst length of 8, if A2=0, the data lines G0E, G0D, G1E, G1D carry the respective items 0–3 in cycles CLK0, CLK1, and the respective items 4–7 in cycles CLK2, CLK3. If A2=1, the lines G0E, G0D, G1E, G1D carry the respective items 4–7 in cycles CLK0, CLK1, and the respective items 0–3 in cycles CLK2, CLK3. Therefore, if A2=0, Y decoder 1310 (FIG. 13) selects the columns with A2=0 in cycles CLK0, CLK1, and the columns with A2=1 in cycles CLK2, CLK3. If A2=1, Y decoder 1310 (FIG. 13) selects the columns with A2=1 in cycles CLK0, CLK1 with A2=0 in cycles CLK2, CLK3.

In Table 5, for the burst length of 4, Lines G0E, G0D, G1E, G1D always carry the respective items 0, 1, 2, 3. For the burst length of 8, line G1E carries item 0 or 4, line G0D carries item 1 or 5, line G1E carries item 2 or 6, and line G1D carries item 3 or 7. The Y circuitry may have to active columns for with different A2 bits in the same clock cycle. For example, for the starting address 001, clock CLK1, the lines G1D, G0E carry the respective items 3 (A2=0) and 4 (A2=1).

A memory may provide both the DDR and DDR2 operations, or the memory may be configurable by a metal mask option, a fuse, or an input signal to provide only the DDR or DDR2 operation but not both.

TABLE 4

DDR INTERLEAVED TYPE DATA PATH

| Burst Len | A1A0, Data Sequence | Prefetch Clock Cycle | WD0R | WD0F | WD1R | WD1F |
|---|---|---|---|---|---|---|
| 2 | 00 0-1 | CLK0 | G0E(0) | G0D(1) | not used | not used |
|  | 01 1-0 | CLK0 | G0D(1) | G0E(0) | not used | not used |
|  | 10 2-3 | CLK0 | G1E(2) | G1D(3) | not used | not used |
|  | 11 3-2 | CLK0 | G1D(3) | G1E(2) | not used | not used |
|  | A1A0, Data Sequence |  |  |  |  |  |
| 4 | 00 0-1-2-3 | CLK0 | G0E(0) | G0D(1) | not used | not used |
|  |  | CLK1 | not used | not used | G1E(2) | G1D(3) |
|  | 01 1-0-3-2 | CLK0 | G0D(1) | G0E(0) | not used | not used |
|  |  | CLK1 | not used | not used | G1D(3) | G1E(2) |
|  | 10 2-3-0-1 | CLK0 | G1E(2) | G1D(3) | not used | not used |
|  |  | CLK1 | not used | not used | G0E(0) | G0D(1) |
|  | 11 3-2-1-0 | CLK0 | G1D(3) | G1E(2) | not used | not used |
|  |  | CLK1 | not used | not used | G0D(1) | G0E(0) |
|  | A2A1A0, Data Sequence |  |  |  |  |  |
| 8 | 000 0-1-2-3- 4-5-6-7 | CLK0 | G0E(0) | G0D(1) | not used | not used |
|  |  | CLK1 | not used | not used | G1E(2) | G1D(3) |
|  |  | CLK2 | G0E(4) | G0D(5) | not used | not used |
|  |  | CLK3 | not used | not used | G1E(6) | G1D(7) |
|  | 001 1-0-3-2- 5-4-7-6 | CLK0 | G0D(1) | G0E(0) | not used | not used |
|  |  | CLK1 | not used | not used | G1D(3) | G1E(2) |
|  |  | CLK2 | G0D(5) | G0E(4) | not used | not used |
|  |  | CLK3 | not used | not used | G1D(7) | G1E(6) |
|  | 010 2-3-0-1- 6-7-4-5 | CLK0 | G1E(2) | G1D(3) | not used | not used |
|  |  | CLK1 | not used | not used | G0E(0) | G0D(1) |
|  |  | CLK2 | G1E(6) | G1D(7) | not used | not used |
|  |  | CLK3 | not used | not used | G0E(4) | G0D(5) |
|  | 011 3-2-1-0- 7-6-5-4 | CLK0 | G1D(3) | G1E(2) | not used | not used |
|  |  | CLK1 | not used | not used | G0D(1) | G0E(0) |
|  |  | CLK2 | G1D(7) | G1E(6) | not used | not used |
|  |  | CLK3 | not used | not used | G0D(5) | G0E(4) |
|  | 100 4-5-6-7- 0-1-2-3 | CLK0 | G0E(4) | G0D(5) | not used | not used |
|  |  | CLK1 | not used | not used | G1E(6) | G1D(7) |
|  |  | CLK2 | G0E(0) | G0D(1) | not used | not used |
|  |  | CLK3 | not used | not used | G1E(2) | G1D(3) |
|  | 101 5-4-7-6- 1-0-3-2 | CLK0 | G0D(5) | G0E(4) | not used | not used |
|  |  | CLK1 | not used | not used | G1D(7) | G1E(6) |
|  |  | CLK2 | G0D(1) | G0E(0) | not used | not used |
|  |  | CLK3 | not used | not used | G1D(3) | G1E(2) |
|  | 110 6-7-4-5- 2-3-0-1 | CLK0 | G1E(6) | G1D(7) | not used | not used |
|  |  | CLK1 | not used | not used | G0E(4) | G0D(5) |
|  |  | CLK2 | G1E(2) | G1D(3) | not used | not used |
|  |  | CLK3 | not used | not used | G0E(0) | G0D(1) |
|  | 111 7-6-5-4- 3-2-1-0 | CLK0 | G1D(7) | G1E(6) | not used | not used |
|  |  | CLK1 | not used | not used | G0D(5) | G0E(4) |
|  |  | CLK2 | G1D(3) | D1E(2) | not used | not used |
|  |  | CLK3 | not used | not used | G0D(1) | G0E(0) |

TABLE 5

DDR SEQUENTIAL TYPE DATA PATH

| Burst Len | A1A0, Data Sequence | Prefetch Clock Cycle | WD0R | WD0F | WD1R | WD1F |
|---|---|---|---|---|---|---|
| 2 | 00 0-1 | CLK0 | G0E(0) | G0D(1) | not used | not used |
|  | 01 1-0 | CLK0 | G0D(1) | G0E(0) | not used | not used |
|  | 10 2-3 | CLK0 | G1E(2) | G1D(3) | not used | not used |
|  | 11 3-2 | CLK0 | G1D(3) | G1E(2) | not used | not used |
|  | A1A0, Data Sequence |  |  |  |  |  |
| 4 | 00 0-1-2-3 | CLK0 | G0E(0) | G0D(1) | not used | not used |
|  |  | CLK1 | not used | not used | G1E(2) | G1D(3) |
|  | 01 1-2-3-0 | CLK0 | G0D(1) | G1E(2) | not used | not used |
|  |  | CLK1 | not used | not used | G1D(3) | G0E(0) |
|  | 10 2-3-0-1 | CLK0 | G1E(2) | G1D(3) | not used | not used |
|  |  | CLK1 | not used | not used | G0E(0) | G0D(1) |
|  | 11 3-0-1-2 | CLK0 | G1D(3) | G0E(0) | not used | not used |
|  |  | CLK1 | not used | not used | G0D(1) | G1E(2) |
|  | A2A1A0, Data Sequence |  |  |  |  |  |
| 8 | 000 0-1-2-3- 4-5-6-7 | CLK0 | G0E(0) | G0D(1) | not used | not used |
|  |  | CLK1 | not used | not used | G1E(2) | G1D(3) |
|  |  | CLK2 | G0E(4) | G0D(5) | not used | not used |
|  |  | CLK3 | not used | not used | G1E(6) | G1D(7) |
|  | 001 1-2-3-4- 4-6-7-0 | CLK0 | G0D(1) | G1E(2) | not used | not used |
|  |  | CLK1 | not used | not used | G1D(3) | G0E(4) |
|  |  | CLK2 | G0D(5) | G1E(6) | not used | not used |
|  |  | CLK3 | not used | not used | G1D(7) | G0E(0) |
|  | 010 2-3-4-5- 6-7-0-1 | CLK0 | G1E(2) | G1D(3) | not used | not used |
|  |  | CLK1 | not used | not used | G0E(4) | G0D(5) |
|  |  | CLK2 | G1E(6) | G1D(7) | not used | not used |
|  |  | CLK3 | not used | not used | G0E(0) | G0D(1) |
|  | 011 3-4-5-6- 7-0-1-2 | CLK0 | G1D(3) | G0E(4) | not used | not used |
|  |  | CLK1 | not used | not used | G0D(5) | G1E(6) |
|  |  | CLK2 | G1D(7) | G0E(0) | not used | not used |
|  |  | CLK3 | not used | not used | G0D(1) | G1E(2) |
|  | 100 4-5-6-7- 0-1-2-3 | CLK0 | G0E(4) | G0D(5) | not used | not used |
|  |  | CLK1 | not used | not used | G1E(6) | G1D(7) |
|  |  | CLK2 | G0E(0) | G0D(1) | not used | not used |
|  |  | CLK3 | not used | not used | G1E(2) | G1D(3) |
|  | 101 5-6-7-0- 1-2-3-4 | CLK0 | G0D(5) | G1E(6) | not used | not used |
|  |  | CLK1 | not used | not used | G1D(7) | G0E(0) |
|  |  | CLK2 | G0D(1) | G1E(2) | not used | not used |
|  |  | CLK3 | not used | not used | G1D(3) | G0E(4) |
|  | 110 6-7-0-1- 2-3-4-5 | CLK0 | G1E(6) | G1D(7) | not used | not used |
|  |  | CLK1 | not used | not used | G0E(0) | G0D(1) |
|  |  | CLK2 | G1E(2) | G1D(3) | not used | not used |
|  |  | CLK3 | not used | not used | G0E(4) | G0D(5) |
|  | 111 7-0-1-2- 3-4-5-6 | CLK0 | G1D(7) | G0E(0) | not used | not used |
|  |  | CLK1 | not used | not used | G0D(1) | G1E(2) |
|  |  | CLK2 | G1D(3) | G0E(4) | not used | not used |
|  |  | CLK3 | not used | not used | G0D(5) | G1E(6) |

Figure 14:
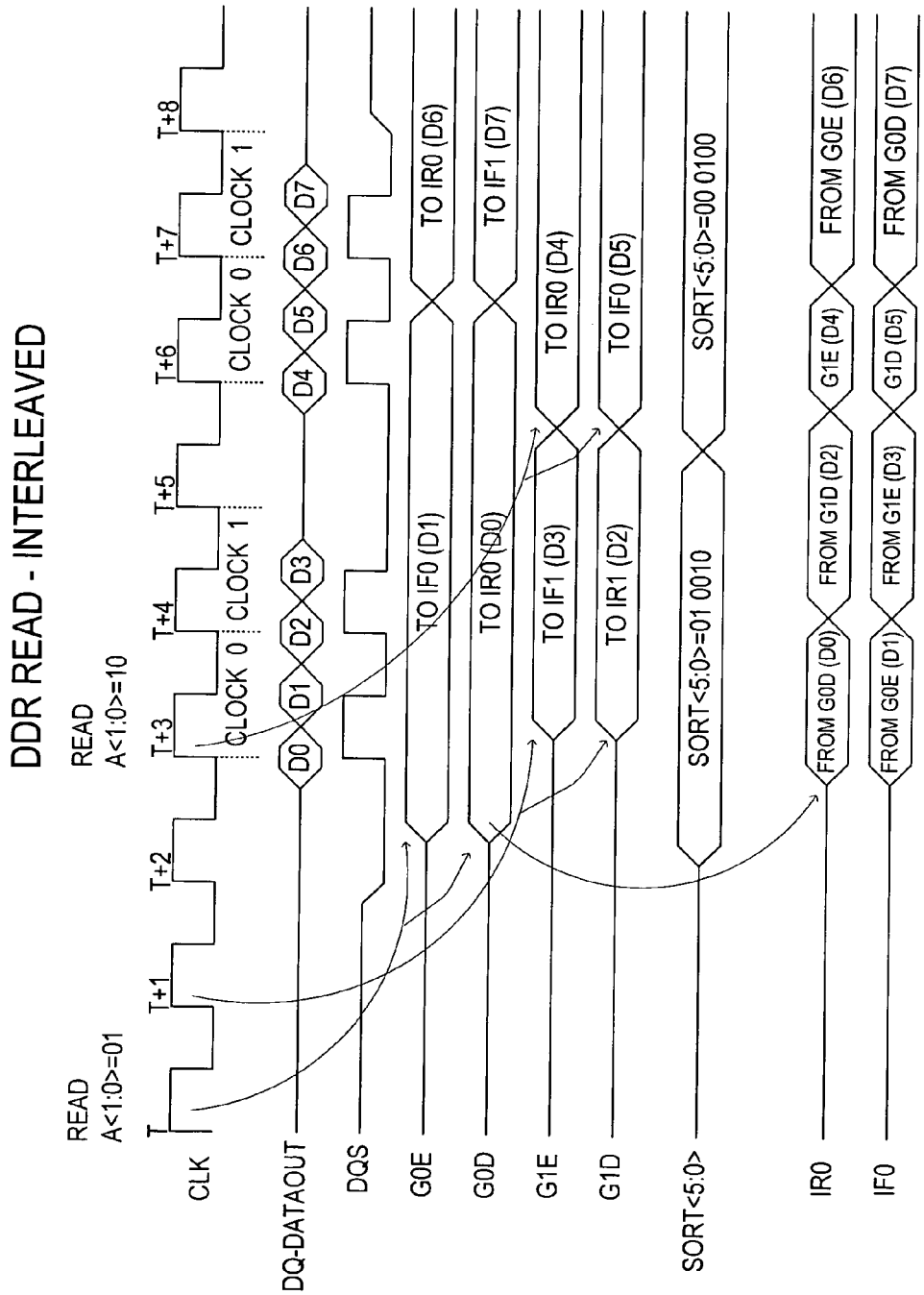
FIGS. 14, 15 are timing diagrams of memory signals according to embodiments of the present invention.

FIG. 14 is a timing diagram of two consecutive DDR interleave read operations with a burst length of 4 and a CAS latency of 3. A read command is issued in a clock cycle T with A<1:0>=01. Two data items D0, D1 are read out in parallel from the respective arrays 110.01, 110.00 of one of the memory banks 210 and driven on the respective lines G0D, G0E as a result of the read command. The SORT signals become valid around the same time that the data D0, D1 are driven onto the two G-lines. Data D0, D1 are transferred in parallel to respective I-lines IR0, IF0, and then serially to the DQ terminal on the respective rising and falling edges of clock T+3. DQS is driven high for the rising edge data, and low for the falling edge data, in accordance with the DDR standard. I-lines IR1, IF1 are unused in the DDR read operations.

As a result of the read command in clock cycle T and of the rising edge of clock T+1, two data items D2, D3 are read out in parallel from the respective arrays 110.11. 110.10 and driven on the respective lines G1D, G1E. Data D2, D3 are transferred in parallel to respective I-lines IR0, IF0, and then read out to the DQ terminal on the respective rising and falling edges of clock T+4. DQS is driven high for the rising edge data, and low for the falling edge data.

Another read command is issued in clock cycle T+3 with A<1:0>=10. The read operation timing is similar.

Figure 15:
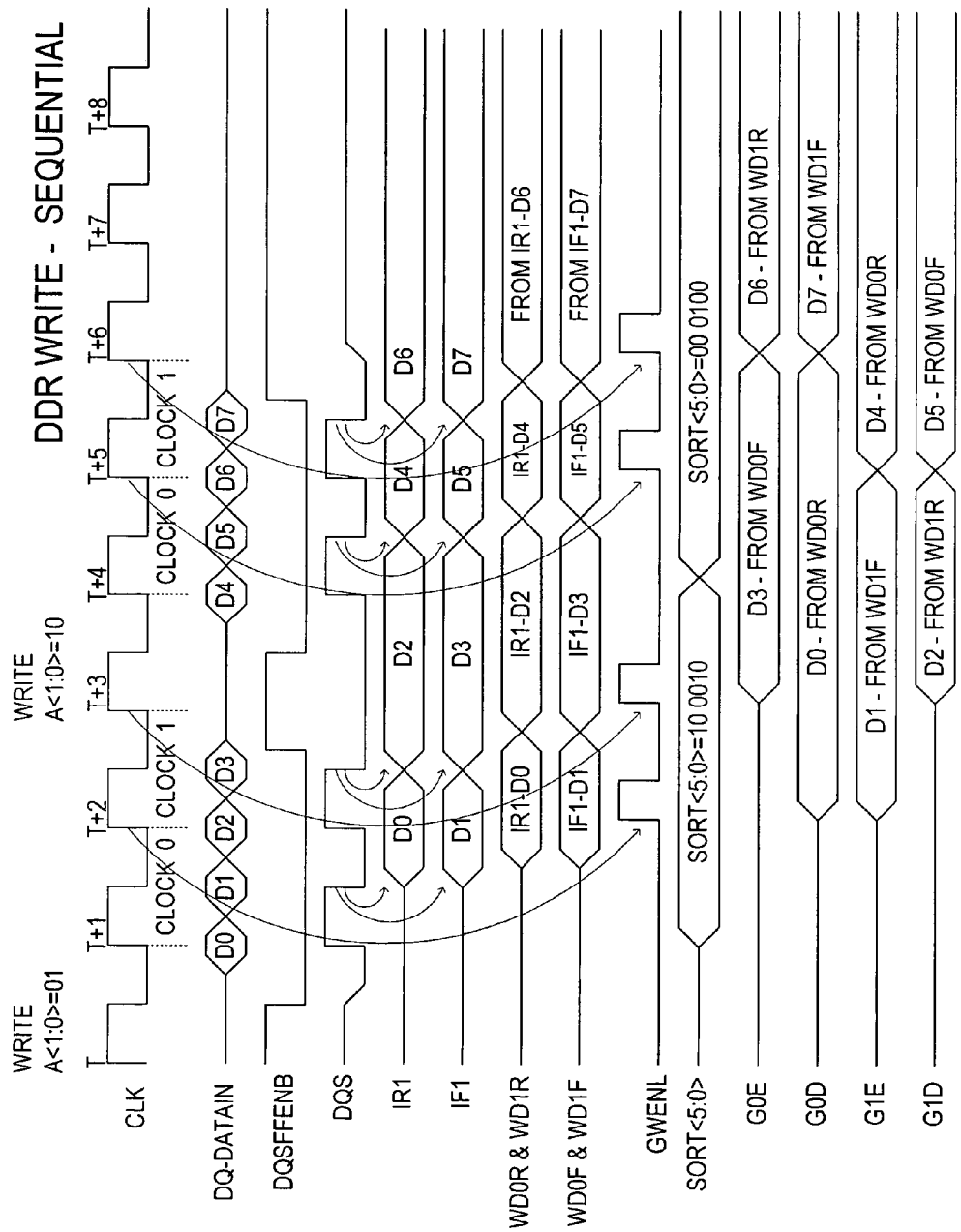

FIG. 15 is a timing diagram of two consecutive burst write operations for a sequential burst type and a burst length of 4. A write command is issued in a clock cycle T with A<1:0>=01. DQSFFENB becomes asserted to enable the DQS latching, and four data items D0–D3 are latched from the DQ terminal on the rising and falling edges of clocks T+1, T+2 synchronously with the DQS signal, as specified in the DDR standard. Upon the falling edge of the DQS signal after the rising edge of clock cycle T+1, data items D0, D1 are driven onto respective lines IR1, IF1 as described above. Then item D0 is transferred to both lines WD0R, WD1R, and item D1 is transferred to both line WD0F, WD1F. Upon the falling edge of the DQS signal after the rising edge of clock cycle T+2, data items D2, D3 are driven onto respective lines IR1, IF1, and then onto respective lines WD0R/WD1R, WD0F/WD1F. The SORT signals become valid in cycle T+1. The signals GWENL of circuits 710-0D, 710-1E are pulsed as a result of the rising edge of T+2, and the data items D0, D1 are transferred to respective lines G0D, G1E and then written in parallel to the respective arrays 110.01, 110.10 of one of the memory banks. The signals GWENL of circuits 710-0E, 710-1D are pulsed as a result of the rising edge of T+3, and the data items D2, D3 are transferred to respective lines G1D, G0E and then written in parallel to the respective arrays 110.11, 110.01 of the memory bank. Another write command is issued in cycle T+3 with A<1:0>=10, and is performed with a similar timing.

The invention is not limited to the embodiments described above. For example, the burst operations of Tables 1–5 can be provided in a single data rate memory, or in a memory with one data item read or written per clock cycle, per two clock cycles, or per any number of clock cycles. Different portions of sorting circuit 140 can be located in different parts of the memory. For example, multiplexers 510 (FIGS. 5A–5D) may be grouped together in one part of the memory, and multiplexers (FIGS. 7A–7D) in another part. The circuitry of FIGS. 2–13 is exemplary and not limiting. CMOS and non-CMOS circuits can be used. Each I-line or G-line can be formed from one conductive layer or from multiple conductive layers separated by dielectric layers and interconnected through openings in the dielectric. The invention is not limited to a particular type of a memory cell. The invention is applicable to DRAM (pseudo-SRAM) cells disclosed in U.S. Pat. No. 6,285,578 issued Sep. 4, 2001 to Huang and incorporated herein by reference, and to other DRAM and non-DRAM memory cells, known or to be invented. Other embodiments and variations are within the scope of the invention, as defined by the appended claims.

The invention claimed is:

1. An integrated circuit comprising a memory providing read and write burst operations with data sequences defined in Table 2, the memory comprising:

a plurality of memory cells;
circuitry for providing a first signal specifying whether a burst operation to be performed is sequential or interleaved, and specifying a burst length and at least two least significant address bits A0 and A1 of a starting address of the burst operation;
at least four multiplexer circuits ("read multiplexer circuits") Mr1, Mr2, Mr3, Mr4 . . . , wherein each read multiplexer circuit Mri (i=1, 2, 3, 4 . . . ) comprises one or more multiplexers, wherein each read multiplexer circuit Mri is to receive data read from the memory cells in a burst read operation and to select a respective ith data item to be provided serially by the memory in the burst read operation, the data item comprising one or more data bits; and
at least four multiplexer circuits ("write multiplexer circuits") Mw1, Mw2, Mw3, Mw4 . . . , wherein each write multiplexer circuit Mwi (i=1, 2, 3, 4 . . . ) comprises one or more multiplexers, wherein each write multiplexer circuit Mwi is to receive data to be written to the memory cells in a burst write operation and to select a data item to be written at an address A1A0=i;
circuitry for receiving in parallel data items selected by the read multiplexer circuits and for providing the data items serially as an output of a burst read operation; and
circuitry for receiving in parallel data items selected by the write multiplexer circuits and for writing the data items in parallel to the memory cells.

2. The integrated circuit of claim 1 further comprising a circuit for generating control signals for the read and write multiplexer circuits, the control signals being functions of the first signal, wherein the functions are all members of a group of at most six functions and their compliments.

3. The integrated circuit of claim 1 wherein the at least four read multiplexer circuits are exactly four read multiplexer circuits, and the at least four write multiplexer circuits are exactly four write multiplexer circuits.

4. The integrated circuit of claim 3 wherein each data item comprises M bits, M being equal to 1, 4, 8, or 16, and each read and write multiplexer circuit comprises M multiplexers.

5. The integrated circuit of claim 1 wherein each multiplexer of each read multiplexer circuit comprises a transistor having a first terminal for receiving an input signal and a second terminal for providing a signal to an output of the multiplexer, wherein the second terminals of at least two of the transistors are connected together.

6. The integrated circuit of claim 1 wherein each multiplexer of each write multiplexer circuit comprises a transistor having a first terminal for receiving an input signal and a second terminal for providing a signal to an output of the multiplexer, wherein the second terminals of at least two of the transistors are connected together.

7. The integrated circuit of claim 1 wherein in each burst operation, two data items are read out of the memory or written to the memory in a clock cycle.

8. An integrated circuit comprising a memory providing read burst operations with a prefetch, the memory comprising:

a plurality of arrays of memory cells;
a plurality of first lines for receiving data items from the arrays in parallel in a burst read operation;
at least four multiplexer circuits ("read multiplexer circuits") Mr1, Mr2, Mr3, Mr4 . . . , wherein each read multiplexer circuit Mri (i=1, 2, 3, 4 . . . ) comprises one or more multiplexers, wherein each read multiplexer circuit Mri is to receive data from the first data lines and to select a respective ith data item to be provided serially by the memory in the burst read operation, each data item comprising one or more data bits;

a plurality of second lines for receiving data in parallel from the read multiplexer circuits; and circuitry for receiving in parallel data items from the second lines and providing the data items serially as an output of a burst read operation;

wherein the read multiplexer circuits are located in an array region defined as the smallest rectangular region containing the arrays of the memory cells.

9. The integrated circuit of claim 8 comprising at least four arrays positioned on four different sides of a region containing the read multiplexer circuits.

10. The integrated circuit of claim 8 wherein each read multiplexer circuit selects data items based on at least the least significant bit of a starting address of a burst read operation.

11. The integrated circuit of claim 10 wherein each read multiplexer circuit selects data items based on at least two least significant bits of the starting address.

12. The integrated circuit of claim 10 wherein each read multiplexer circuit selects data items based on at least whether a burst operation is sequential or interleaved, wherein the sequential and interleaved burst operations are defined as in at least one of Tables 1 and 2.

13. An integrated circuit comprising a memory providing write burst operations with a prefetch, the memory comprising:

a plurality of arrays of memory cells;

a plurality of first lines for providing data items to the arrays in parallel in a burst write operation;

at least four multiplexer circuits ("write multiplexer circuits") Mw1, Mw2, Mw3, Mw4 . . . , wherein each write multiplexer circuit Mwi (i=1, 2, 3, 4 . . . ) comprises one or more multiplexers, wherein each write multiplexer circuit Mwi is to receive data provided serially to the memory in a burst write operation and to select one of the data items to be carried by a subset of one or more of the first lines in the burst write operation, each data item comprising one or more data bits;

a plurality of second lines for providing data in parallel to the write multiplexer circuits; and circuitry for receiving data items serially as an input for the burst write operation and providing the data items in parallel to the second lines;

wherein the write multiplexer circuits are located in an array region defined as the smallest rectangular region containing the arrays of the memory cells.

14. The integrated circuit of claim 13 comprising at least four arrays positioned on four different sides of a region containing the write multiplexer circuits.

15. The integrated circuit of claim 13 wherein each write multiplexer circuit selects data items based on at least the least significant bit of a starting address of a burst write operation.

16. The integrated circuit of claim 15 wherein each write multiplexer circuit selects data items based on at least two least significant bits of the starting address.

17. The integrated circuit of claim 15 wherein each write multiplexer circuit selects data items based on at least whether a burst operation is sequential or interleaved, wherein the sequential and interleaved burst operations are defined as in at least one of Tables 1 and 2.

18. An integrated circuit comprising a memory providing read and write burst operations with multiple data sequences, the memory comprising:

a plurality of memory cells;

a plurality of first conductive paths for carrying read and write data for the burst operations, wherein each first conductive path carries read and/or write data for a group of memory cells with addresses having a corresponding predetermined value of a predefined set of one or more address bits;

a plurality of second conductive paths for carrying read and write data for the burst operations, wherein each second conductive path carries read data in a predetermined position or positions in a serial read data stream in the burst operations, and/or carries write data in a predetermined position or positions in a serial write data stream in the burst operations;

a sorting circuit for transferring the read data from the first conductive paths to the second conductive paths, and for transferring the write data from the second conductive paths to the first conductive paths;

wherein at least one first conductive path has a first end connected to an output of a first driver in the sorting circuit, and has a second end opposite to the first end, and the first conductive path consists of a conductive line, or comprises a conductive line and one or more transistors connected in series with the conductive line, with the one or more transistors being adjacent to the second end, and no transistors of the first conductive path being adjacent to the first end; and wherein at least one second conductive path has a first end connected to an input of the sorting circuit, and has a second end opposite to the first end and connected to a second driver, and the second conductive path consists of a conductive line, or comprises a conductive line and one or more transistors connected in series with the conductive line, with the one or more transistors of the second conductive path being adjacent to the first end of the second conductive path, and no transistors of the second conductive path being adjacent to the second end of the second conductive path.

19. An integrated circuit comprising a memory providing read and write burst operations with multiple data sequences, the memory comprising:

a plurality of memory cells;

a plurality of first conductive paths for carrying read and write data for the burst operations, wherein each first conductive path carries read and/or write data for a group of memory cells with addresses having a corresponding predetermined value of a predefined set of one or more address bits;

a plurality of second conductive paths for carrying read and write data for the burst operations, wherein each second conductive path carries read data in a predetermined position or positions in a serial read data stream in the burst operations, and/or carries write data in a predetermined position or positions in a serial write data stream in the burst operations;

a sorting circuit for transferring the read data from the first conductive paths to the second conductive paths, and for transferring the write data from the second conductive paths to the first conductive paths;

wherein at least one first conductive path comprises a conductive line connected directly to a driver in the sorting circuit for carrying write data, the conductive line being at least ¼ of a length of the first conductive path; and wherein at least one second conductive path is connected to an input of the sorting circuit, and includes a conductive line connected to a driver outside of the sorting circuit, with the conductive line being at least ¼ of a length of the second conductive path.

20. The integrated circuit of claim 19 wherein the conductive line of the at least one first conductive path is at least ¾ of the length of the first conductive path.

21. The integrated circuit of claim 20 wherein the conductive line of the at least one second conductive path is at least ¾ of the length of the second conductive path.

22. An integrated circuit comprising a memory providing write burst operations with multiple data sequences, the memory comprising:
a plurality of memory cells;
at least four first conductive paths for carrying write data for the burst operations, wherein each first conductive path carries write data for a group of memory cells with addresses having a corresponding predetermined value of a predefined set of one or more address bits;
at least four second conductive paths for carrying write data for the burst operations, wherein each second conductive path carries write data in a predetermined position or positions in a serial write data stream in the burst operations;
a sorting circuit for transferring the write data from the second conductive paths to the first conductive paths for writing in parallel at least four serially received data items from the first conductive paths into the memory cells, or for writing in parallel only two serially received data items from the first conductive paths into the memory cells;
a first circuit for providing serially received data items on the second conductive paths such that, for the writing in parallel of only two serially received data items into the memory cells, the first conductive circuit provides one of the two data items in parallel on at least two of the second conductive paths and, at the same time, provides the other one of the data items in parallel on at least two of the remaining second conductive paths.

23. A method for performing read and write burst operations with data sequences defined in Table 2, the method comprising:
(1) providing a first signal specifying whether a burst operation or operations to be performed are sequential or interleaved, and specifying a burst length and at least two least significant column address bits A0 and A1 of a starting address of the burst operation or operations;
(2) in a read burst operation:
(2a) reading at least four data items from memory cells of a memory, and providing the at least four data items to respective at least four multiplexer circuits ("read multiplexer circuits") Mr1, Mr2, Mr3, Mr4 . . . , wherein each read multiplexer circuit Mri (i=1, 2, 3, 4 . . . ) comprises one or more multiplexers;
(2b) each read multiplexer circuit Mri (i=0, 1, . . . ) selecting a respective ith data item to be provided serially by the memory in the burst read operation, the data item comprising one or more data bits; and
(2c) receiving in parallel data items selected by the read multiplexer circuits and providing the data items serially as an output of the burst read operation;
(3) in a write burst operation:
(3a) receiving serially data items as an input of the write burst operation and providing at least four of the data items to respective at least four multiplexer circuits ("write multiplexer circuits") Mw1, Mw2, Mw3, Mw4 . . . , wherein each write multiplexer circuit Mwi (i=1, 2, 3, 4 . . . ) comprises one or more multiplexers;
(3b) each write multiplexer circuit Mwi (i=1, 2, 3, 4 . . . ) selecting a data item to be written at an address A1A0=i; and
(3c) receiving in parallel data items selected by the write multiplexer circuits and writing the data items in parallel to the memory cells.

24. The method of claim 23 further comprising generating control signals for the read and write multiplexer circuits, the control signals being functions of the first signal, wherein the functions are all members of a group of at most six functions and their compliments.

25. The method of claim 23 wherein the at least four read multiplexer circuits are exactly four read multiplexer circuits, and the at least four write multiplexer circuits are exactly four write multiplexer circuits,
the read data sorting circuit comprises exactly four read multiplexer circuits, and the write data sorting circuit comprises exactly four write multiplexer circuits.

26. The method of claim 25 wherein each data item comprises M bits, M being equal to 1, 4, 8, or 16, and each read and write multiplexer circuit comprises M multiplexers.

27. The method of claim 25 wherein each multiplexer of each read multiplexer circuit comprises a transistor having a first terminal for receiving an input signal and a second terminal for providing a signal to an output of the multiplexer, wherein the second terminals of at least two of the transistors are connected together.

28. The method of claim 23 wherein each multiplexer of each write multiplexer circuit comprises a transistor having a first terminal for receiving an input signal and a second terminal for providing a signal to an output of the multiplexer, wherein the second terminals of at least two of the transistors are connected together.

29. The method of claim 23 wherein in the operation (2c) two data items are provided serially in a clock cycle, and in the operation (3a) two data items are received serially in a clock cycle.

30. A method for performing write burst operations with multiple data sequences, the memory comprising:
a plurality of memory cells;
at least four first conductive paths for carrying write data for the burst operations, wherein each first conductive path carries write data for a group of memory cells with addresses having a corresponding predetermined value of a predefined set of one or more address bits;
at least four second conductive paths for carrying write data for the burst operations, wherein each second conductive path carries write data in a predetermined position or positions in a serial write data stream in the burst operations;
a sorting circuit for transferring the write data from the second conductive paths to the first conductive paths for writing in parallel at least four serially received data items from the first conductive paths into the memory cells, or for writing in parallel only two serially received data items from the first conductive paths into the memory cells;
the method comprising providing serially received data items onto the second conductive paths such that, for the writing in parallel of only two serially received data items into the memory cells, one of the two data items are provided in parallel on at least two of the second conductive paths and, at the same time, the other one of the data items are provided in parallel on at least two of the remaining second conductive paths.

* * * * *